United States Patent
Sebastian et al.

(10) Patent No.: US 9,642,243 B2
(45) Date of Patent: May 2, 2017

(54) FLEXIBLE TOUCH SENSOR WITH FINE PITCH INTERCONNECT

(71) Applicant: 3M INNOVATIVE PROPERTIES COMPANY, St. Paul, MN (US)

(72) Inventors: Muthu Sebastian, Singapore (SG); Dominic M. Travasso, Singapore (SG); Nancy S. Lennhoff, North Andover, MA (US); Steven T. Swartz, Pepperell, MA (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 276 days.

(21) Appl. No.: 14/240,815

(22) PCT Filed: Sep. 27, 2012

(86) PCT No.: PCT/US2012/057415
§ 371 (c)(1),
(2) Date: Feb. 25, 2014

(87) PCT Pub. No.: WO2013/049267
PCT Pub. Date: Apr. 4, 2013

(65) Prior Publication Data
US 2014/0299365 A1  Oct. 9, 2014

Related U.S. Application Data

(60) Provisional application No. 61/541,563, filed on Sep. 30, 2011.

(51) Int. Cl.
| G03C 5/58 | (2006.01) |
| H05K 1/02 | (2006.01) |
| G06F 3/044 | (2006.01) |
| H05K 3/06 | (2006.01) |
| H05K 1/09 | (2006.01) |

(52) U.S. Cl.
CPC .......... H05K 1/0274 (2013.01); G06F 3/044 (2013.01); H05K 3/06 (2013.01); H05K 1/09 (2013.01); *H05K 2201/0302* (2013.01); *H05K 2201/032* (2013.01)

(58) Field of Classification Search
USPC ........................................ 430/318, 316, 394
See application file for complete search history.

(56) References Cited

U.S. PATENT DOCUMENTS

| 3,448,098 A | 6/1969 | Gaines |
| 3,469,982 A | 9/1969 | Celeste |
| 3,526,504 A | 9/1970 | Celeste |
| 3,867,153 A | 2/1975 | Maclachlan |
| 4,733,222 A | 3/1988 | Evans |
| 5,386,219 A | 1/1995 | Greanias |
| 5,432,671 A | 7/1995 | Allavena |
| 5,648,642 A | 7/1997 | Miller |
| 5,840,402 A * | 11/1998 | Roberts ............... H05K 1/0287 174/250 |
| 6,545,744 B2 | 4/2003 | Zemel |
| 6,759,181 B2 | 7/2004 | Hanson |
| 7,081,888 B2 | 7/2006 | Cok et al. |
| 7,351,519 B2 | 4/2008 | Cowan |
| 7,439,962 B2 | 10/2008 | Reynolds |
| 7,450,296 B2 | 11/2008 | Jang |
| 7,663,607 B2 | 2/2010 | Hotelling |
| 8,847,392 B2 | 9/2014 | Endo et al. |
| 2002/0117672 A1 | 8/2002 | Chu |
| 2003/0094663 A1 | 5/2003 | Sato |
| 2005/0083307 A1 | 4/2005 | Aufderheide |
| 2007/0134837 A1 | 6/2007 | Sato |
| 2009/0096759 A1 | 4/2009 | Nishiwaki |
| 2009/0273570 A1 | 11/2009 | Degner |
| 2010/0102027 A1* | 4/2010 | Liu .................. G06F 3/044 216/13 |
| 2010/0300773 A1 | 12/2010 | Cordeiro |
| 2011/0139516 A1 | 6/2011 | Nirmal et al. |
| 2011/0151215 A1 | 6/2011 | Kobayashi |
| 2014/0124477 A1 | 5/2014 | Sebastian |

FOREIGN PATENT DOCUMENTS

| CN | 102096535 | 6/2011 |
| JP | 2011-054208 | 3/2011 |
| JP | 2011-129165 | 6/2011 |
| JP | 2011-164886 | 8/2011 |
| JP | 2011-164887 | 8/2011 |

OTHER PUBLICATIONS

International Search Report for PCT Application No. PCT/US2010/057415 Mailed on Mar. 4, 2013, 3 pages.

* cited by examiner

Primary Examiner — Daborah Chacko Davis
(74) Attorney, Agent, or Firm — Clifton F. Richardson; Johannes P. M. Kusters

(57) ABSTRACT

An article includes a multilayer structure, such as, e.g., a touch sensor, having two opposing sides and comprising a central polymeric UV transparent substrate, a transparent conductive layer on each of the two major opposing surfaces of the polymeric substrate, a metallic conductive layer on each transparent conductive layer, and a patterned photoimaging mask on each metallic conductive layer.

12 Claims, 15 Drawing Sheets

FLEXIBLE TOUCH SENSOR WITH FINE PITCH INTERCONNECT

CROSS REFERENCE TO RELATED APPLICATIONS

This application is a national stage filing under 35 U.S.C. 371 of PCT/US2012/057415, filed 27 Sep. 2012, which claims priority to U.S. Provisional Application No. 61/541,563, filed 30 Sep. 2011, the disclosure of which is incorporated by reference in its/their entirety herein.

BACKGROUND

Touch sensitive devices have become an increasingly common way for users to interact with electronic systems, typically those that include tablets, touch phones, and other commercial touch interactive systems. Touch sensitive devices allow a user to conveniently interface with electronic systems and displays by reducing or eliminating the need for mechanical buttons, keypads, keyboards, and pointing devices. For example, a user can carry out a complicated sequence of instructions by simply touching an on-display touch screen at a location identified by an icon.

There are several types of technologies for implementing a touch sensitive device including, for example, resistive, infrared, capacitive, surface acoustic wave, electromagnetic, near field imaging, etc. Capacitive touch sensing devices have been found to work well in a number of applications. In many touch sensitive devices, the input is sensed when a conductive object in the sensor is capacitively coupled to a conductive touch implement such as a user's finger. Generally, whenever two electrically conductive members come into proximity with one another without actually touching, a capacitance is formed therebetween. In the case of a capacitive touch sensitive device, as an object such as a finger approaches the touch sensing surface, a tiny capacitance forms between the object and the sensing points in close proximity to the object. By detecting changes in capacitance at each of the sensing points and noting the position of the sensing points, the sensing circuit can recognize multiple objects and determine the characteristics of the object as it is moved across the touch surface.

Capacitive touch sensitive devices often include layers of patterned transparent conductors as sensing elements. The patterned transparent conductors often include arrays of long, narrow transparent conductive electrodes in the form of rows and columns. Electrical contacts are established between the controller and the transparent electrodes by providing a conductive metal pattern. In one known method, flexible printed circuits (FPC) are directly bonded to the tail portions of the transparent conductors using anisotropic conductive film (ACF) bonding. In another known method, conductive metal patterns and bonding pads are provided to each transparent electrode by printing methods. For example, conductive inks are applied on the transparent conductors and fired to create the conductive traces on the tail portions of the transparent electrodes.

FPC and ACF bonding processes are expensive and involve high cycle time. Conductive ink printing methods require a large non-sensing area of the sensor because of limitations in providing fine pitch by the conductive ink printing process. Moreover, the higher firing temperature leads to reliability problems such as, e.g., cracks in indium tin oxide (ITO) and haze formation from the base film.

To get a matrix type sensor, row electrodes and column electrodes are laminated in orthogonal direction using optically clear adhesive. Precise alignment is important between the row and column electrodes which otherwise would result in low yield. Moreover, the formation of bubbles and air gaps is unavoidable during the lamination process. Layers of row and column electrodes together with optically clear adhesive and base polyester film may result in a thick sensor.

SUMMARY

In one aspect, the present invention provides a method comprising providing a multilayer structure, such as, e.g., a touch sensor, having two opposing sides and comprising a central polymeric UV transparent substrate having two major opposing surfaces, a transparent conductive layer on each of the two major opposing surfaces of the polymeric substrate, and a metallic conductive layer on each transparent conductive layer; applying and patterning first photoimaging layers on both metallic conductive layers to form photoimaging masks having desired patterns for the transparent conductive layers; etching the portions of the metallic conductive layers and transparent conductive layers exposed by the photoimaging masks; removing the photoimaging masks; applying and patterning second photoimaging layers over the remaining portions of each metallic conductive layer to form photoimaging masks having the desired patterns for the metallic conductive layers; and etching the exposed portions of the metallic conductive layers.

In another aspect, the present invention provides a method comprising providing a multilayer structure, such as, e.g., a touch sensor, having two opposing sides and comprising a central polymeric UV transparent substrate having two major opposing surfaces, a transparent conductive layer on each of the two major opposing surfaces of the polymeric substrate, and a metallic conductive layer on each transparent conductive layer; applying and patterning first photoimaging layers on both metallic conductive layers to form photoimaging masks having desired patterns for the transparent conductive layers and the metallic conductive layers; etching the portions of the metallic conductive layers and transparent conductive layers exposed by the photoimaging masks; removing the photoimaging masks; applying and patterning second photoimaging layers over the remaining portions of each metallic conductive layer to form photoimaging masks protecting the desired patterns of the metallic conductive layers; and etching the exposed portions of the metallic conductive layers.

In another aspect, the present invention provides an article comprising a multilayer structure, such as, e.g., a touch sensor, having two opposing sides and comprising a central polymeric UV transparent substrate, a transparent conductive layer on each of the two major opposing surfaces of the polymeric substrate, a metallic conductive layer on each transparent conductive layer, and a patterned photoimaging mask on each metallic conductive layer.

In another aspect, the present invention provides an article comprising a multilayer structure, such as, e.g., a touch sensor, having two opposing sides and comprising a central polymeric UV transparent substrate having opposing major surfaces, patterned transparent conductive layers on opposing major surfaces of the substrate, and patterned metallic conductive layers on both transparent conductive layers, wherein the polymeric UV transparent substrate has a refractive index greater than about 1.60.

The above summary of the present invention is not intended to describe each disclosed embodiment or every implementation of the present invention. The Figures and detailed description that follow below more particularly exemplify illustrative embodiments.

BRIEF DESCRIPTION OF THE DRAWINGS

In the Figures, like reference numerals designate like elements.

DETAILED DESCRIPTION

In the following detailed description of the preferred embodiments, reference is made to the accompanying drawings that form a part hereof. The accompanying drawings show, by way of illustration, specific embodiments in which the invention may be practiced. It is to be understood that other embodiments may be utilized, and structural or logical changes may be made without departing from the scope of the present invention. The following detailed description, therefore, is not to be taken in a limiting sense, and the scope of the invention is defined by the appended claims.

At least some embodiments of the present invention include matrix type electrodes comprising row and column electrodes on the opposing sides of a substrate. This can eliminate the need for two substrate layers with transparent electrodes, optically clear adhesive, and lamination process. In addition, in at least some embodiments of the present invention, conductive bus bars with fine pitch density and bonding pads are provided to connect the transparent electrodes with controller units, for example. The fine pitch conductive bus bars along the edges of the transparent electrodes reduce the non-touch-sensing area and eliminate the need for larger size discrete connectors, expensive discrete FPC, ACF bonding to the transparent electrodes, conductive ink printing, and firing process. Compared to conductive ink printing, conductive bus bars with substantially vertical walls and an optimized top surface area may be achieved. Embodiments of the present invention may provide a high transmittance, e.g., greater than about 87% and a low haze, e.g., less than 1%. Resulting from the capability to provide relatively thick conductive bus bars, embodiments of the present invention may provide a low resistance and a high signal response.

The electrode patterns may embody bars, triangles, honeycombs, or any other suitable pattern. The transparent electrodes may be coupled to electronic components that detect changes in inter-electrode, or electrode-to-ground capacitance, and thereby determine the coordinates of a touch or near touch.

Figure 1:
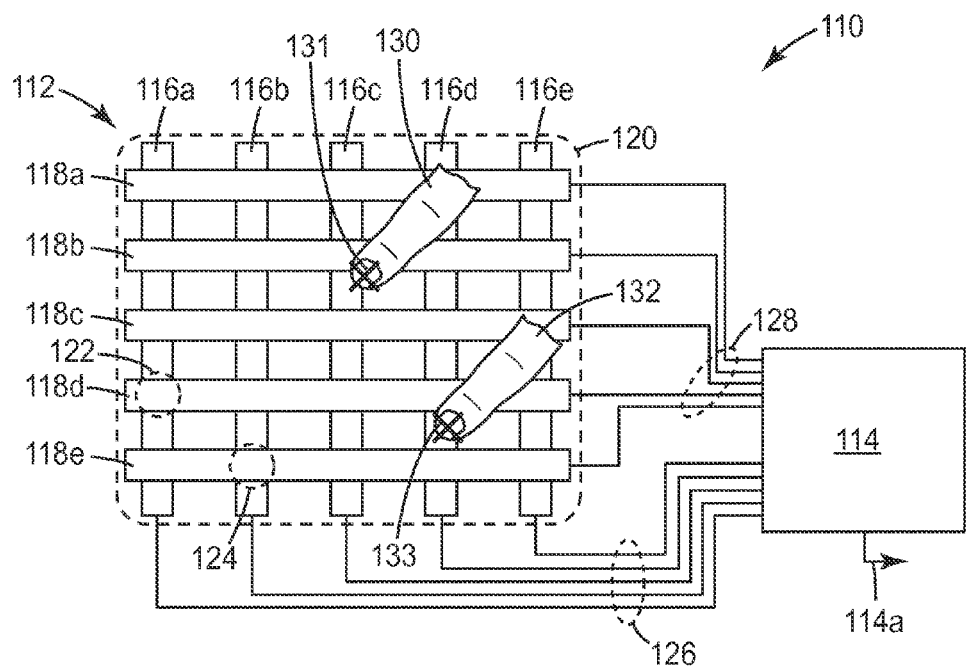
FIG. 1 is a schematic top view of an exemplary embodiment of a touch sensitive device and electronics according to an aspect of the present invention.

FIG. 1 illustrates an exemplary embodiment of a touch sensitive device and electronics according to an aspect of the present invention. Touch sensitive device 110 includes a touch panel 112 connected to electronic circuitry, which for simplicity is grouped together into a single schematic box labeled 114 and referred to collectively as a controller.

The touch panel 112 is shown as having a 5×5 matrix of column electrodes 116a-e and row electrodes 118a-e, but other numbers of electrodes and other matrix sizes can also be used. The panel 112 is typically substantially transparent so that the user is able to view an object, such as the pixilated display of a computer, hand-held device, mobile phone, or other peripheral device, through the panel 112. The boundary 120 represents the viewing area of the panel 112 and also preferably the viewing area of such a display, if used. The electrodes 116a-e, 118a-e are spatially distributed, from a plan view perspective, over the viewing area 120. For ease of illustration, the electrodes are shown to be wide and obtrusive, but in practice they may be relatively narrow and inconspicuous to the user. Further, they may be designed to have variable widths, e.g., an increased width in the form of a diamond- or other-shaped pad in the vicinity of the nodes of the matrix in order to increase the inter-electrode fringe field and thereby increase the effect of a touch on the electrode-to-electrode capacitive coupling. In exemplary embodiments, the electrodes may be composed of indium tin oxide (ITO) or other suitable electrically conductive materials. From a depth perspective, the column electrodes may lie in a different plane than the row electrodes (from the perspective of FIG. 1, the column electrodes 116a-e lie underneath the row electrodes 118a-e) such that no significant conductive contact is made between column and row electrodes, and so that the only significant electrical coupling between a given column electrode and a given row electrode is capacitive coupling. The matrix of electrodes typically lies beneath a cover glass, plastic film, or the like, so that the electrodes are protected from direct physical contact with a user's finger or other touch-related implement. An exposed surface of such a cover glass, film, or the like may be referred to as a touch surface.

The capacitive coupling between a given row and column electrode is primarily a function of the geometry of the electrodes in the region where the electrodes are closest together. Such regions correspond to the "nodes" of the electrode matrix, some of which are labeled in FIG. 1. For example, capacitive coupling between column electrode 116a and row electrode 118d occurs primarily at node 122, and capacitive coupling between column electrode 116b and row electrode 118e occurs primarily at node 124. The 5×5 matrix of FIG. 1 has 25 such nodes, any one of which can be addressed by controller 114 via appropriate selection of one of the control lines 126, which individually couple the respective column electrodes 116a-e to the controller, and appropriate selection of one of the control lines 128, which individually couple the respective row electrodes 118a-e to the controller.

When a finger 130 of a user or other touch implement comes into contact or near-contact with the touch surface of the device 110, as shown at touch location 131, the finger capacitively couples to the electrode matrix and draws charge away from the matrix, particularly from those electrodes lying closest to the touch location, and in doing so it changes the coupling capacitance between the electrodes corresponding to the nearest node(s). For example, the touch at touch location 131 lies nearest the node corresponding to electrodes 116c/118b. As described further below, this change in coupling capacitance can be detected by controller 114 and interpreted as a touch at or near the 116c/118b node. Preferably, the controller is configured to rapidly detect the change in capacitance, if any, at all of the nodes of the matrix, and is capable of analyzing the magnitudes of capacitance changes for neighboring nodes so as to accurately determine a touch location lying between nodes by interpolation. Furthermore, the controller 114 advantageously is designed to detect multiple distinct touches applied to different portions of the touch device at the same time, or at overlapping times. Thus, for example, if another finger 132 touches the touch surface of the device 110 at touch location 133 simultaneously with the touch of finger 130, or if the respective touches at least temporally overlap, the controller is preferably capable of detecting the positions 131, 133 of both such touches and providing such locations on a touch output 114a. The number of distinct simultaneous or temporally overlapping touches capable of being detected by controller 114 is preferably not limited to 2, e.g., it may be 3, 4, or more, depending on the size of the electrode matrix.

Controller 114 may employ a variety of circuit modules and components that enable it to rapidly determine the coupling capacitance at some or all of the nodes of the electrode matrix. For example, the controller may include at least one signal generator or drive unit. The drive unit delivers a drive signal to one set of electrodes, referred to as drive electrodes. In the embodiment of FIG. 1, the column electrodes 116a-e may be used as drive electrodes, or the row electrodes 118a-e may be so used. The drive signal may be delivered to the electrodes in various ways, e.g., one drive electrode at a time in a scanned sequence from a first to a last drive electrode. As each such electrode is driven, the controller monitors the other set of electrodes, referred to as receive electrodes. The controller 114 may include one or more sense units coupled to all of the receive electrodes. Circuits suitable for sensing multiple contacts made to touch panel 112 are further described in US Patent Application Publication No. 2010/0300773, "High Speed Multi-Touch Device and Controller Therefor."

The controller may also include circuitry to accumulate charge from a series of response signal inputs. Exemplary circuit devices for this purpose may include one or more charge accumulators, e.g., one or more capacitors, the selection of which may depend on the nature of the drive signal and the corresponding response signal. Each pulse results in the accumulation of some quantum of charge and each additional pulse adds successively more. The charge may also be coupled in one cycle and any extra pulses may just allow averaging of the charge for noise reduction. The controller may also include one or more analog-to-digital converters (ADCs) to convert the analog amplitude of the accumulated signal to a digital format. One or more multiplexers may also be used to avoid unnecessary duplication of circuit elements. Of course, the controller also preferably includes one or more memory devices in which to store the measured amplitudes and associated parameters, and a microprocessor to perform the necessary calculations and control functions.

By measuring the voltage of the accumulated charge associated with the response signal for each of the nodes in the electrode matrix for one or more pulses associated with a given measurement cycle, the controller can generate a matrix of measured values related to the coupling capacitances for each of the nodes of the electrode matrix. These measured values can be compared to a similar matrix of previously obtained reference values in order to determine which nodes, if any, have experienced a change in coupling capacitance due to the presence of a touch.

Figure 2:
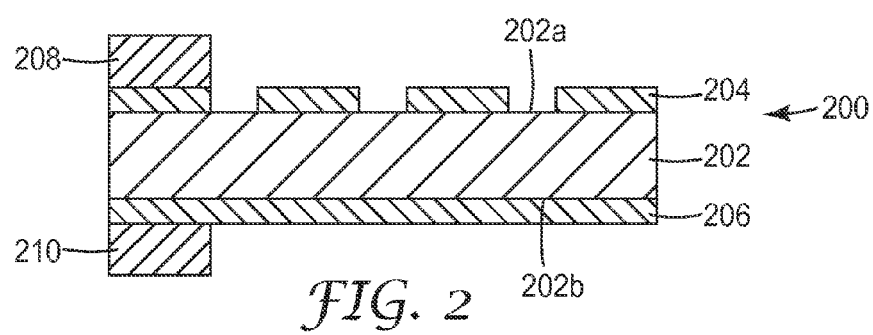
FIG. 2 is a cross-sectional view of an exemplary embodiment of a multilayer structure according to an aspect of the present invention.

FIG. 2 illustrates an exemplary embodiment of a multi-layer structure according to an aspect of the present invention. In one aspect, multilayer structure 200 may be a touch sensor for use in a touch sensitive device, such as, e.g., touch sensitive device 110 of FIG. 1. Multilayer structure 200 has two opposing sides and includes a central polymeric UV transparent substrate 202 having two major opposing surfaces 202a and 202b, a first transparent conductive layer 204 on first major surface 202a of central polymeric UV transparent substrate 202, and a second transparent conductive layer 206 on second major surface 202b of central polymeric UV transparent substrate 202. UV transparent is defined herein as having a transmittance of at least about 70% starting at a wavelength of about 336 nm extending out into the near-infrared. For example, in some embodiments, central polymeric UV transparent substrate 202 has an absorption maximum below about 309 nm, a cut-off wavelength below about 314 nm, and a transmittance of at least about 70% at a wavelength of about 336 nm, and a transmittance of about 89% at a wavelength of about 800 nm. In some embodiments, the transmittance can be about 97% at a wavelength of about 800 nm. In at least one embodiment, central polymeric UV transparent substrate 202 has a thickness of about 125 μm. In some embodiments, the central polymeric UV transparent substrate has a thickness in the range of about 25 to about 175 μm. In some embodiments, central polymeric UV transparent substrate 202 is selected from the group consisting of polyesters, polycarbonates liquid crystal polymers, polyimides, and polyethylene naphthalates. In at least one embodiment, central polymeric UV transparent substrate 202 comprises polyethylene terephthalate (PET). In other embodiments, central polymeric UV transparent substrate 202 comprises polyethylene naphthalate (PEN), which has a high refractive index, e.g., about 1.70, a triacetate (TAC) film, which has a high transmittance, e.g., about 95%, or surface treated PET, which has a high transmittance, e.g., about 96%. Central polymeric UV transparent substrate 202 separates first transparent conductive layer 204 from second transparent conductive layer 206. In at least one embodiment, first transparent conductive layer 204 and second transparent conductive layer 206 have a thickness of about 85 nm. In some embodiments, the transparent conductive layers have a thickness in the range of about 20 nm to about 100 nm. First transparent conductive layer 204 and second transparent conductive layer 206 may have different thicknesses, or may have substantially the same thickness. In some embodiments, first transparent conductive layer 204 and second transparent conductive layer 206 include indium tin oxide (ITO). In some embodiments, the ITO is amorphous. In some embodiments, first transparent conductive layer 204 and second transparent conductive layer 206 include layers of ITO and silicon oxide, and in some embodiments, the silicon oxide is doped with aluminum, as is further described in Singapore Patent Application No. 201105168-7, "Etching Method and Devices Produced Using the Etching Method". For example, in at least one embodiment, the transparent conductive layers include a SiAlO—ITO—SiAlO—ITO layer structure including a first layer of silicon oxide doped with aluminum (SiAlO) having a thickness of about 5 nm, a first layer of ITO having a thickness of about 20 nm, a second layer of silicon oxide doped with aluminum (SiAlO) having a thickness of about 40 nm, and a second layer of ITO having a thickness of about 20 nm. In this embodiment, the first layer of silicon oxide doped with aluminum functions as a tie layer for adhering the first layer of ITO to the central polymeric UV transparent substrate. Compared with a single layer of ITO, the multilayer stack of a first layer of ITO on a second layer of silicon oxide doped with aluminum on a second layer of ITO provides improved optical transmittance, reduced brittleness, higher conductivity, and improved reliability in high temperature and humidity conditions. First transparent conductive layer 204 is patterned to form a first set of electrodes, and second transparent conductive layer 206 is patterned to form a second set of electrodes. In at least one embodiment, the electrodes have a width of about 1 mm. In some embodiments, the electrodes are positioned at a spacing or pitch in the range of about 3.5 mm to about 6.5 mm. The electrodes may have different widths, or may have substantially the same width. In some embodiments, the electrodes of the first set are orthogonal to the electrodes of the second set. In other embodiments, the electrodes of the first set and the electrodes of the second set are not orthogonal to one another. Although in some embodiments both or none of transparent conductive layers are patterned, in other embodiments only one of first transparent conductive layer 204 and second transparent conductive layer 206 is patterned. Multilayer structure 200 further includes a first metallic conductive layer 208 on first transparent conductive layer 204 and a second metallic conductive layer 210 on second transparent conductive layer 206. In at least one embodiment, first metallic conductive layer 208 and second metallic conductive layer 210 have a thickness of about 8 µm. In some embodiments, the metallic conductive layers have a thickness in the range of about 3 µm to about 50 µm, depending on bonding and conductivity requirements, for example. In one aspect, the metallic conductive layers may be provided at a thickness in the range of about 5 µm to about 20 µm to advantageously improve the signal speed of the multilayer structure. First metallic conductive layer 208 and second metallic conductive layer 210 may have different thicknesses, or may have substantially the same thickness. In some embodiments, first metallic conductive layer 208 and second metallic conductive layer 210 are selected from the group consisting of copper, aluminum, gold, silver, nickel, and tin. In some embodiments, first metallic conductive layer 208 and second metallic conductive layer 210 include multiple layers of copper. For example, in at least one embodiment, the metallic conductive layers include a first layer of copper having a thickness in the range of about 100 nm to about 200 nm, and a second layer of copper having a thickness of about 6 µm to about 35 µm disposed on the first layer of copper. In this embodiment, the first layer of copper functions as a tie layer for adhering the second layer of copper to the transparent conductive layer. In some embodiments, first metallic conductive layer 208 is patterned to form a first set of conductive circuits and second metallic conductive layer 210 is patterned to form a second set of conductive circuits.

Figure 3A:
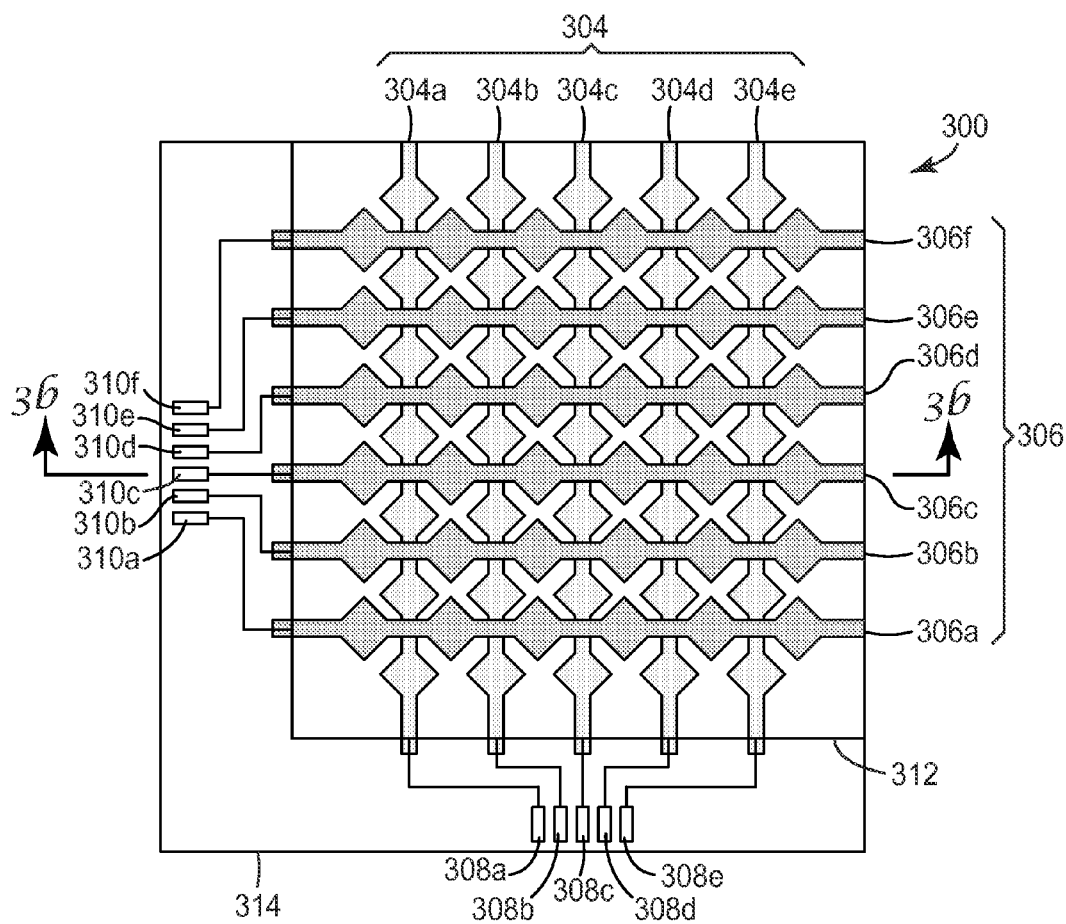
FIGS. 3a-3b are top and cross-sectional views, respectively, of an exemplary embodiment of a multilayer structure according to an aspect of the present invention.
Figure 3B:
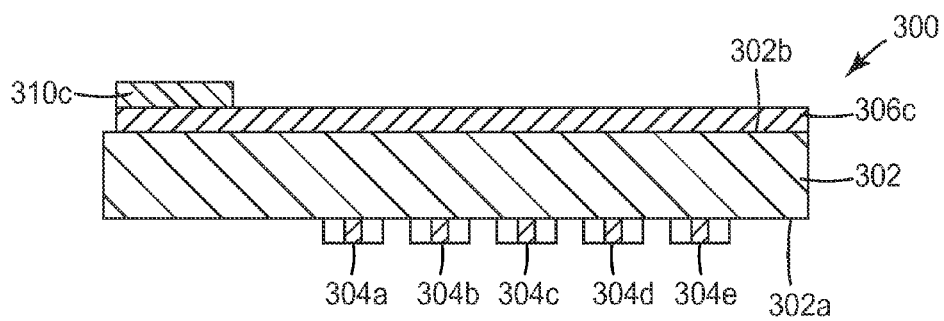

FIGS. 3a and 3b illustrate another exemplary embodiment of a multilayer structure according to an aspect of the present invention. Multilayer structure 300 may be a touch sensor for use in a touch sensitive device, such as, e.g., touch sensitive device 110 of FIG. 1. In some embodiments, multilayer structure 300 has a thickness in the range of about 25 µm to about 1 mm. The size of multilayer structure 300 may be selected based on the intended application. In some embodiments, multilayer structure 300 has a diagonal width in the range of about 24 inches to about 50 inches and a 3:4 aspect ratio. Similar to multilayer structure 200 illustrated in FIG. 2, multilayer structure 300 has two opposing sides and includes a central polymeric UV transparent substrate, a transparent conductive layer on each of the two major opposing surfaces of the central polymeric UV transparent substrate, and a metallic conductive layer on each transparent conductive layer. In multilayer structure 300, a first transparent conductive layer 304 is patterned to form a first set of electrodes 304a-304e, and a second transparent conductive layer 306 is patterned to form a second set of electrodes 306a-306f. Electrodes 304a-304e and electrodes 306a-306f are provided inside a first boundary 312, representing the touch-sensing area of multilayer structure 300. In some embodiments, first boundary 312 also represents the viewing area of a display, if used. In the embodiment illustrated in FIGS. 3a and 3b, five electrodes 304a-304e and six electrodes 306a-306f are orthogonally aligned to define a matrix of column and row electrodes on opposing sides of the central polymeric UV transparent substrate. As can be seen in FIGS. 3a and 3b, each electrode includes a number of diamond-shaped conductive pads arranged in series and in the vicinity of the nodes of the matrix in order to increase the inter-electrode fringe field and thereby increase the effect of a touch on the electrode-to-electrode capacitive coupling. In some embodiments, the diamond-shaped conductive pads have a diagonal width in the range of about 3 mm to about 6 mm. The diamond-shaped conductive pads are arranged such that the conductive pads of electrodes 304a-304e (column electrodes) and the conductive pads of electrodes 306a-306f (row electrodes) do not overlap in a direction normal to the plane of the substrate major surface. The diamond-shaped conductive pads are further arranged generally such that conductive pads of the electrodes positioned on one side of the central polymeric UV transparent substrate are positioned in the center of four adjacent conductive pads of the electrodes positioned on the opposing side of the central polymeric UV transparent substrate. Multilayer structure 300 further includes a first metallic conductive layer 308 on first transparent conductive layer 304 and a second metallic conductive layer 310 on second transparent conductive layer 306. First metallic conductive layer 308 is patterned to form a first set of conductive circuits 308a-308e and second metallic conductive layer 310 is patterned to form a second set of conductive circuits 310a-310f. Conductive circuits 308a-308e and conductive circuits 310a-310f extend into a second boundary 314, representing the non-touch-sensing area of multilayer structure 300. Conductive circuits 308a-308e extend generally in the longitudinal direction of electrodes 304a-304e (column direction) and conductive circuits 310a-310f extend generally in the longitudinal direction of electrodes 306a-306f (row direction). An advantage of multilayer structures according to aspects of the present invention is that the conductive circuits (also referred to herein as bus lines) constitute a fine pitch interconnect for connecting the transparent electrodes to electronic circuitry of a touch sensitive device, for example, incorporated in the multilayer structure along the edges of the touch-sensing area occupying a minimized non-touch-sensing area, which minimizes the overall size of the multilayer structure and eliminates the need for larger size discrete connectors, expensive discrete FPC, ACF bonding to the transparent electrodes, conductive ink printing, and firing process. As can be seen in FIGS. 3a and 3b, conductive circuits 308a-308e and conductive circuits 310a-310f each include a narrow conductive trace connected to a broader conductive pad. In at least one embodiment, the conductive traces have a width of about 250 µm. In some embodiments, the conductive traces have a width in the range of 30 µm to about 100 µm. The conductive traces may have different widths, or may have substantially the same width. In at least one embodiment, the conductive traces are positioned at a spacing or pitch of about 500 µm. In some embodiments, the conductive traces are positioned at a spacing or pitch in the range of about 60 µm to about 200 µm. In one aspect, the broader conductive pads function to facilitate connecting multilayer structure 300 to electronic circuitry (including, e.g, a controller) of a touch sensitive device by bonding a discrete flexible printed circuit, such as, e.g., a T-shaped flexible printed circuit, to the conductive pads of multilayer structure 300 and to the electronic circuitry. These conductive pads may be provided on one or both sides of the multilayer structure to facilitate this connection. In at least one embodiment, the conductive pads have a width of about 250 µm. In some embodiments, the conductive pads have a width in the range of about 75 µm to about 250 µm. In some embodiments, the area of the non-touch-sensing area including the patterned metallic conductive layers is proportional to the number of electrodes used in the multilayer structure. The number of row or column electrodes may vary depending on the application and size of the multilayer structure. In some embodiments, the conductive traces of the patterned first metallic conductive layer 308 on one side of multilayer structure 300 are offset from the conductive traces of the patterned second metallic conductive layer 310 on the other side of multilayer structure 300 such that the traces do not overlap in a direction normal to the plane of the substrate major surface. Beneficially, in such an arrangement, the traces are not capacitively coupled and thereby avoid electrical interference.

Figure 4:
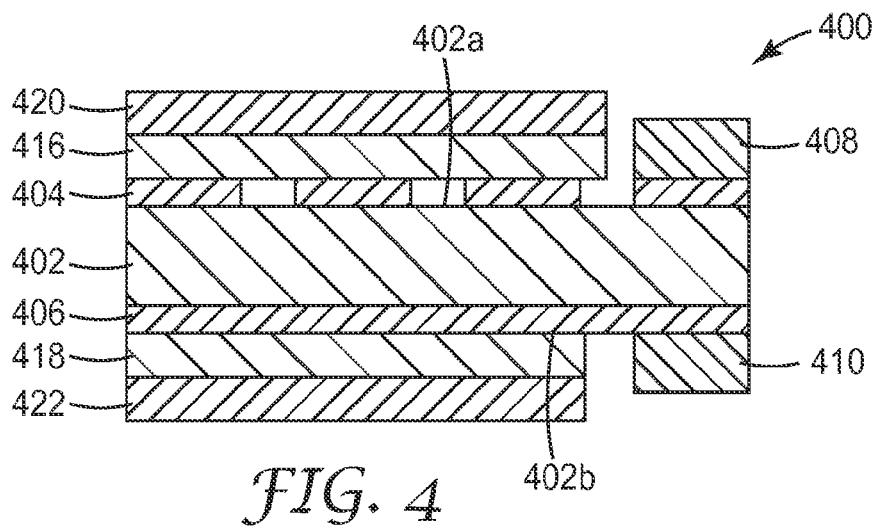
FIG. 4 is a cross-sectional view of an exemplary embodiment of a multilayer structure according to an aspect of the present invention.

FIG. 4 illustrates another exemplary embodiment of a multilayer structure according to an aspect of the present invention. Multilayer structure 400 may be a touch sensor for use in a touch sensitive device, such as, e.g., touch sensitive device 110 of FIG. 1. Similar to multilayer structure 200 illustrated in FIG. 2, multilayer structure 400 has two opposing sides and includes a central polymeric UV transparent substrate 402 having two major opposing surfaces 402a and 402b, a first transparent conductive layer 404 on first major surface 402a of central polymeric UV transparent substrate 402, a second transparent conductive layer 406 on second major surface 402b of central polymeric UV transparent substrate 402, a first metallic conductive layer 408 on first transparent conductive layer 404, and a second metallic conductive layer 410 on second transparent conductive layer 406. First transparent conductive layer 404 is patterned to form a first set of electrodes, and second transparent conductive layer 406 is patterned to form a second set of electrodes. In some embodiments, first metallic conductive layer 408 is patterned to form a first set of conductive circuits and second metallic conductive layer 410 is patterned to form a second set of conductive circuits. Multilayer structure 400 further includes a first adhesive layer 416 disposed on first transparent conductive layer 404 and a second adhesive layer 418 disposed on second transparent conductive layer 406. In some embodiments where first transparent conductive layer 404 is patterned to form a first set of electrodes, and second transparent conductive layer 406 is patterned to form a second set of electrodes, first adhesive layer 416 is disposed such that it substantially covers the first set of electrodes and the portions of central polymeric UV transparent substrate 402 not covered by the first set of electrodes, and second adhesive layer 418 is disposed such that it substantially covers the second set of electrodes and the portions of central polymeric UV transparent substrate 402 not covered by the second set of electrodes. In some embodiments where first metallic conductive layer 408 is patterned to form a first set of conductive circuits and second metallic conductive layer 410 is patterned to form a second set of conductive circuits, at least a portion of the conductive circuits is not covered by the adhesive layers. In one aspect, this facilitates connecting multilayer structure 400 to electronic circuitry (including, e.g., a controller) of a touch sensitive device by bonding a discrete flexible printed circuit to the conductive pads of multilayer structure 400 and to the electronic circuitry. In at least one embodiment, first adhesive layer 416 and second adhesive layer 418 have a thickness of about 50 µm. In some embodiments, the adhesive layers have a thickness in the range of about 50 µm to about 100 µm. First adhesive layer 416 and second adhesive layer 418 may have different thicknesses, or may have substantially the same thickness. In some embodiments, first adhesive layer 416 and second adhesive layer 418 include a pressure sensitive adhesive. In some embodiments, first adhesive layer 416 and second adhesive layer 418 include an optically clear adhesive. The optically clear adhesive may have antistatic properties. Multilayer structure 400 further includes a first hard coat layer 420 attached to first adhesive layer 416 and a second hard coat layer 422 attached to second adhesive layer 418. In at least one embodiment, first hard coat layer 420 and second hard coat layer 422 have a thickness of about 6 µm. In some embodiments, the hard coat layers have a thickness in the range of about 3 µm to about 6 µm. First hard coat layer 420 and second hard coat layer 422 may have different thicknesses, or may have substantially the same thickness. In at least one embodiment, first hard coat layer 420 and second hard coat layer 422 includes PET. In some embodiments, the hard coat layer may include a hard coat applied to a transparent substrate including, e.g., PET, PEN, or a triacetate (TAC) film. The hard coat may contain nanoparticles, such as, e.g. silica and alumina, to protect the substrate from scratches, for example. The hard coat may also have anti-reflection and anti-fingerprint properties.

Figure 5:
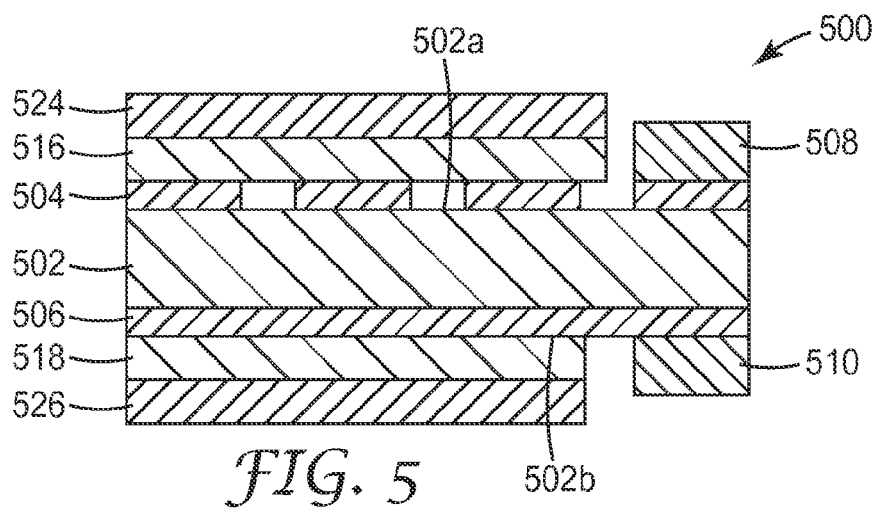
FIG. 5 is a cross-sectional view of an exemplary embodiment of a multilayer structure according to an aspect of the present invention.

FIG. 5 illustrates another exemplary embodiment of a multilayer structure according to an aspect of the present invention. Multilayer structure 500 may be a touch sensor for use in a touch sensitive device, such as, e.g., touch sensitive device 110 of FIG. 1. Similar to multilayer structure 400 illustrated in FIG. 4, multilayer structure 500 has two opposing sides and includes a central polymeric UV transparent substrate 502 having two major opposing surfaces 502a and 502b, a first transparent conductive layer 504 on first major surface 502a of central polymeric UV transparent substrate 502, a second transparent conductive layer 506 on second major surface 502b of central polymeric UV transparent substrate 502, a first metallic conductive layer 508 on first transparent conductive layer 504, a second metallic conductive layer 510 on second transparent conductive layer 506, a first adhesive layer 516 disposed on first transparent conductive layer 504, and a second adhesive layer 518 disposed on second transparent conductive layer 506. First transparent conductive layer 504 is patterned to form a first set of electrodes, and second transparent conductive layer 506 is patterned to form a second set of electrodes. In some embodiments, first metallic conductive layer 508 is patterned to form a first set of conductive circuits and second metallic conductive layer 510 is patterned to form a second set of conductive circuits. In some embodiments where first transparent conductive layer 504 is patterned to form a first set of electrodes, and second transparent conductive layer 506 is patterned to form a second set of electrodes, first adhesive layer 516 is disposed such that it substantially covers the first set of electrodes and the portions of central polymeric UV transparent substrate 502 not covered by the first set of electrodes, and second adhesive layer 518 is disposed such that it substantially covers the second set of electrodes and the portions of central polymeric UV transparent substrate 502 not covered by the second set of electrodes. In some embodiments where first metallic conductive layer 508 is patterned to form a first set of conductive circuits and second metallic conductive layer 510 is patterned to form a second set of conductive circuits, at least a portion of the conductive circuits is not covered by the adhesive layers. In one aspect, this facilitates connecting multilayer structure 500 to electronic circuitry (including, e.g., a controller) of a touch sensitive device by bonding a discrete flexible printed circuit to the conductive pads of multilayer structure 500 and to the electronic circuitry. Multilayer structure 500 further includes a glass panel 524 attached to first adhesive layer 516 and a display unit 526 attached to second adhesive layer 518. In at least one embodiment, glass panel 524 has a thickness of about 0.7 mm. In some embodiments, glass panel 524 has a thickness in the range of about 0.5 mm to about 1 mm. In one aspect, glass panel 524 functions to protect the multilayer structure from wear and tear. In at least one embodiment, display unit 526 is a liquid crystal display (LCD) panel.

Figure 6:
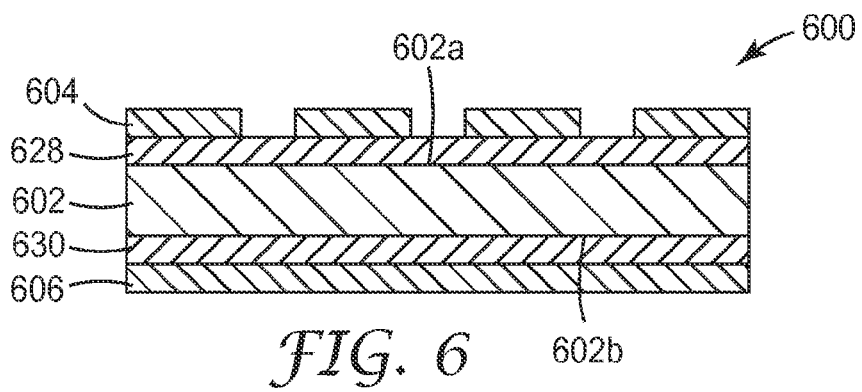
FIG. 6 is a cross-sectional view of an exemplary embodiment of a multilayer structure according to an aspect of the present invention.

FIG. 6 illustrates another exemplary embodiment of a multilayer structure according to an aspect of the present invention. Multilayer structure 600 may be a touch sensor for use in a touch sensitive device, such as, e.g., touch sensitive device 110 of FIG. 1. Multilayer structure 600 has two opposing sides and includes a central polymeric UV transparent substrate 602 having two major opposing surfaces 602a and 602b, a first coating 628 on first major surface 602a of central polymeric UV transparent substrate 602, a second coating 630 on second major surface 602b of central polymeric UV transparent substrate 602, a first transparent conductive layer 604 on first coating 628, and a second transparent conductive layer 606 on second coating 630. In at least one embodiment, central polymeric UV transparent substrate 602 has a thickness of about 125 μm. In some embodiments, the central polymeric UV transparent substrate has a thickness in the range of about 25 μm to about 200 μm. In some embodiments, central polymeric UV transparent substrate 602 is selected from the group consisting of polyesters, polycarbonates, liquid crystal polymers, polyimides, and polyethylene naphthalates. In at least one embodiment, central polymeric UV transparent substrate 602 includes PET. In some embodiments, first coating 628 and second coating 630 function to reduce the level of haze formation by preventing the oligomer migration from central polymeric UV transparent substrate 602. In at least one embodiment, first coating 628 and second coating 630 have a thickness of about 1 μm. In some embodiments, the coatings have a thickness in the range of 1 μm to about 6 μm. First coating 628 and second coating 630 may have different thicknesses, or may have substantially the same thickness. Beneficially, the capacitance between the transparent conductive layers may be increased (or decreased) by increasing (or decreasing) the coating thickness. In at least one embodiment, first coating 628 and second coating 630 have a refractive index of about 1.50. In some embodiments, the coatings have a refractive index in the range of about 1.47 to about 2.00. In some embodiments, the refractive index on one side of the multilayer structure is different from the refractive index on the other side. Some embodiments include multiple coatings with different refractive indices. In at least one embodiment, the coatings include a suitable UV curable adhesive such as, e.g., acrylate or epoxy. Suitable UV curable adhesives may be provided with or without the addition of nanoparticles. Nanoparticles such as, e.g., silica or zirconia, having a size in the range of about 1 nm to about 75 nm may be dispersed in the coating formulation. In at least one embodiment, the size of the nanoparticles does not exceed the thickness of the coating layers. Central polymeric UV transparent substrate 602, first coating 628, and second coating 630 separate first transparent conductive layer 604 from second transparent conductive layer 606. In at least one embodiment, first transparent conductive layer 604 and second transparent conductive layer 606 have a thickness of about 20 nm. In some embodiments, the transparent conductive layers have a thickness in the range of about 15 nm to about 30 nm. First transparent conductive layer 604 and second transparent conductive layer 606 may have different thicknesses, or may have substantially the same thickness. In some embodiments, first transparent conductive layer 604 and second transparent conductive layer 606 include indium tin oxide (ITO). In some embodiments, the ITO is amorphous. In some embodiments, first transparent conductive layer 604 and second transparent conductive layer 606 include layers of ITO and silicon oxide. In some embodiments, the silicon oxide is doped with aluminum. First transparent conductive layer 604 is patterned to form a first set of electrodes, and second transparent conductive layer 606 is patterned to form a second set of electrodes. In at least one embodiment, the electrodes have a width of about 1 mm. In some embodiments, the electrodes are positioned at a spacing or pitch in the range of about 3.5 mm to about 6.5 mm. The electrodes may have different widths, or may have substantially the same width. In some embodiments, the electrodes of the first set are orthogonal to the electrodes of the second set. In other embodiments, the electrodes of the first set and the electrodes of the second set are not orthogonal to one another.

Figure 7A:
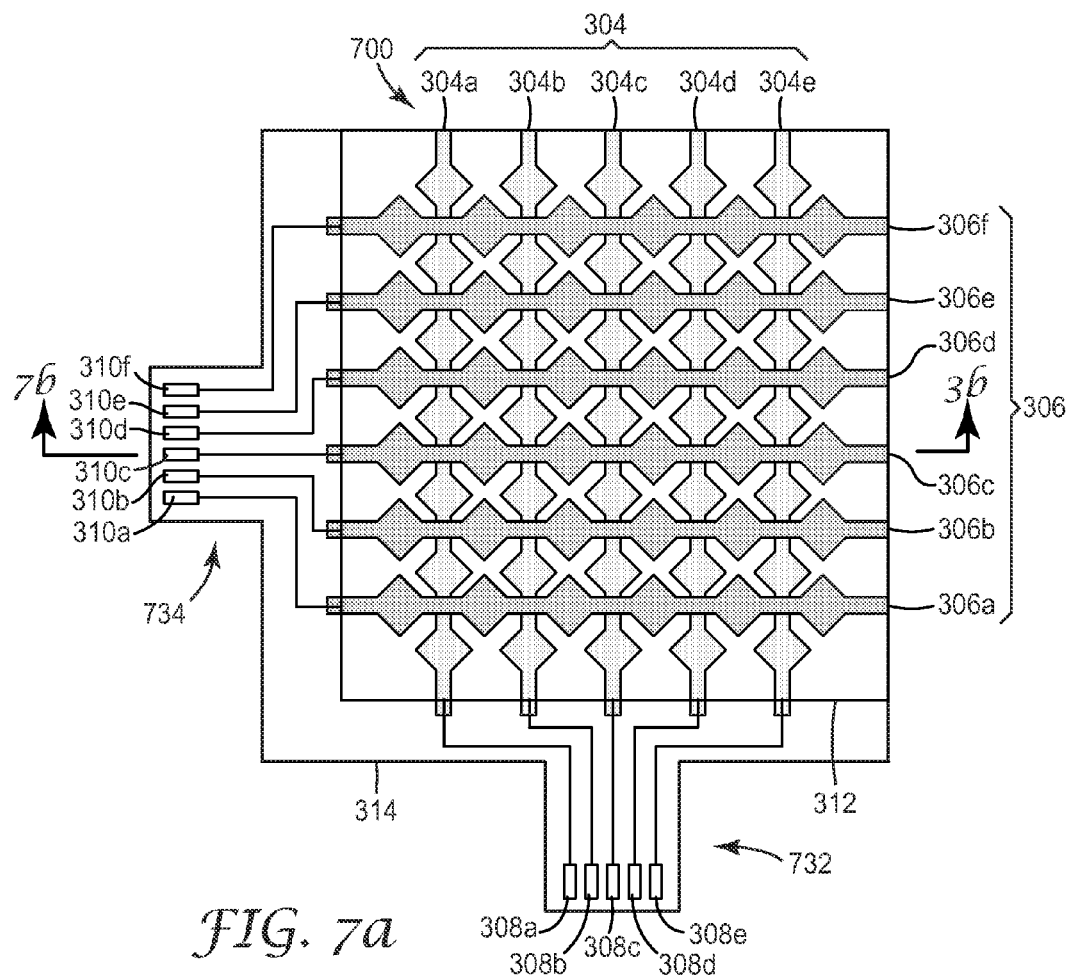
FIGS. 7a-7b are top and cross-sectional views, respectively, of an exemplary embodiment of a multilayer structure according to an aspect of the present invention.
Figure 7B:
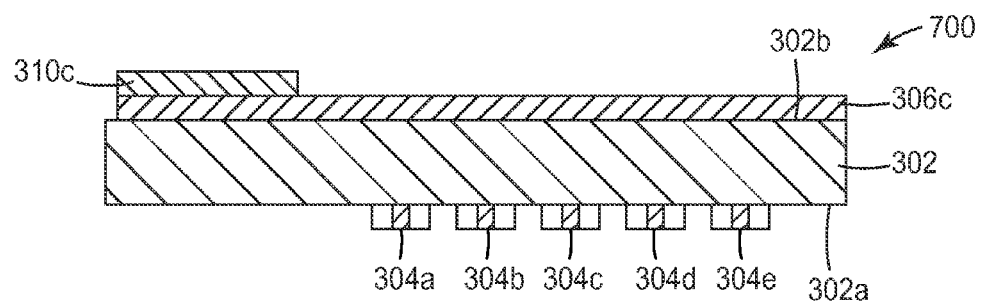

FIGS. 7a-7b illustrate another exemplary embodiment of a multilayer structure according to an aspect of the present invention. Multilayer structure 700 may be a touch sensor for use in a touch sensitive device, such as, e.g., touch sensitive device 110 of FIG. 1. Similar to multilayer structure 200 illustrated in FIG. 2, multilayer structure 700 has two opposing sides and includes a central polymeric UV transparent substrate, a transparent conductive layer on each of the two major opposing surfaces of the central polymeric UV transparent substrate, and a metallic conductive layer on each transparent conductive layer. Multilayer structure 700 is similar to multilayer structure 300 illustrated in FIGS. 3a-3b. Multilayer structure 700 is different from multilayer structure 300 illustrated in FIGS. 3a and 3b in that it includes a first longitudinal connector tail 732 extending from the non-touch-sensing area in the longitudinal direction of electrodes 304a-304e (column direction) and a second longitudinal connector tail 734 extending from the non-touch-sensing area in the longitudinal direction of electrodes 306a-306f (row direction). Conductive circuits 308a-308e and conductive circuits 310a-310f extend into the non-touch-sensing area of multilayer structure 700, and along a length of connector tail 732 and connector tail 734, respectively. In one aspect, the connector tails function to facilitate a direct connection between the broader conductive pads of multilayer structure 700 and electronic circuitry (including, e.g., a controller) of a touch sensitive device by bonding the conductive pads directly to the electronic circuitry, without the need for one or more discrete flexible printed circuits. Thus, instead of a multi-piece structure including one or more discrete flexible printed circuits, a single-piece structure may be provided Eliminating the need for one or more discrete flexible printed circuits also eliminates the difficulty associated with bonding the one or more flexible printed circuits to the multilayer structure, in particular once the multilayer structure is laminated to a glass panel, for example. The connector tails may be formed by die-cutting the central polymeric UV transparent substrate to the desired shape. In one aspect, the length of the connector tails may be selected based on the location of the electronic circuitry and the distance between the electronic circuitry and the non-touch-sensing area.

Figure 8A:
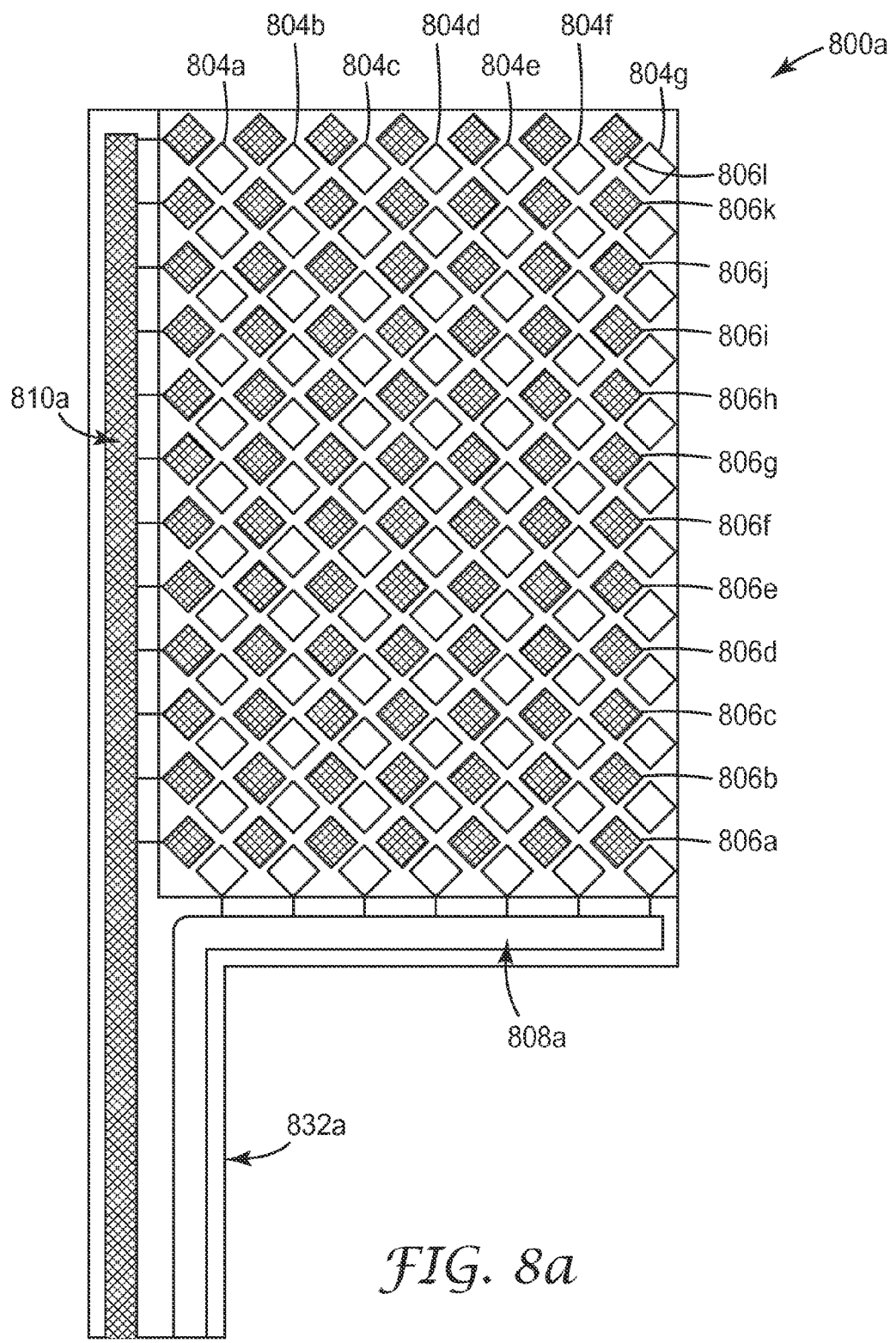
FIGS. 8a-8e are schematic top views of exemplary embodiments of a multilayer structure according to aspects of the present invention.
Figure 8B:
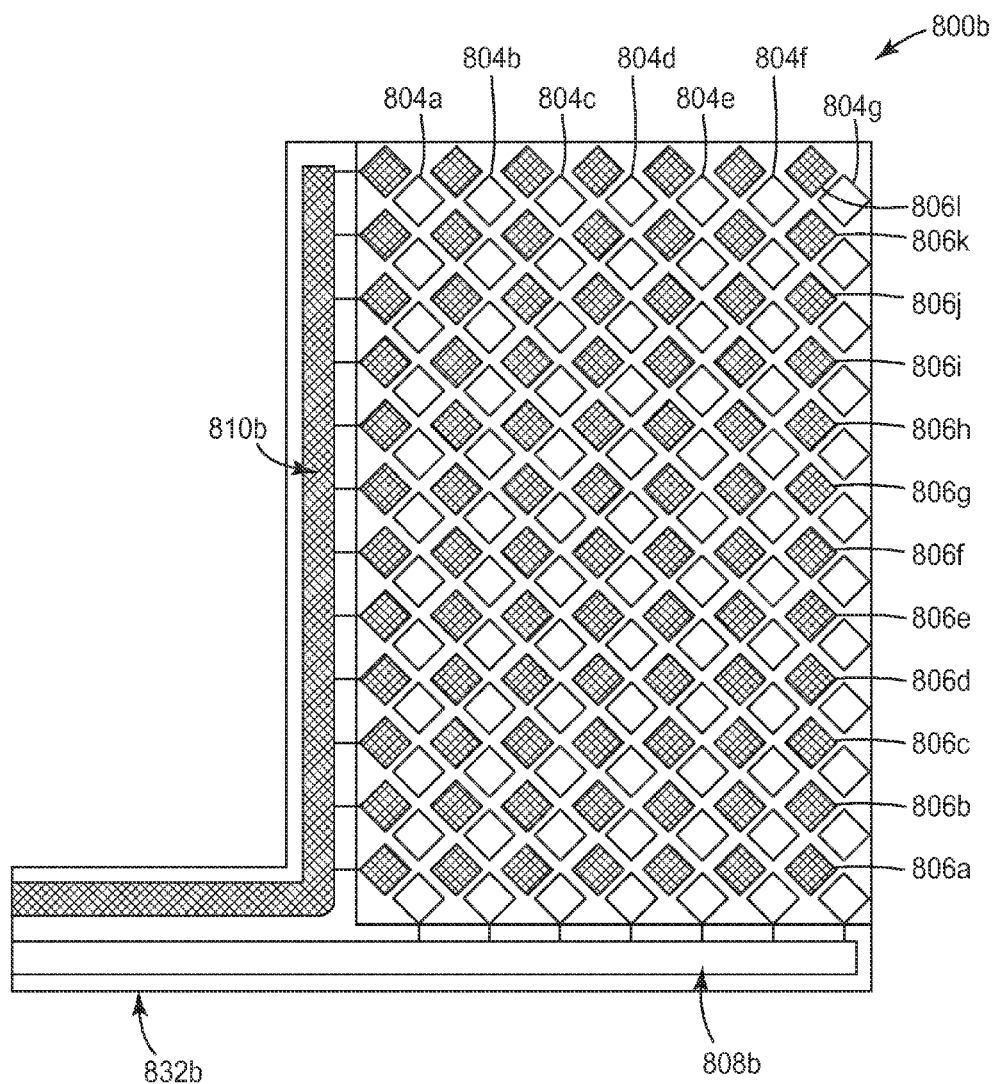
Figure 8C:
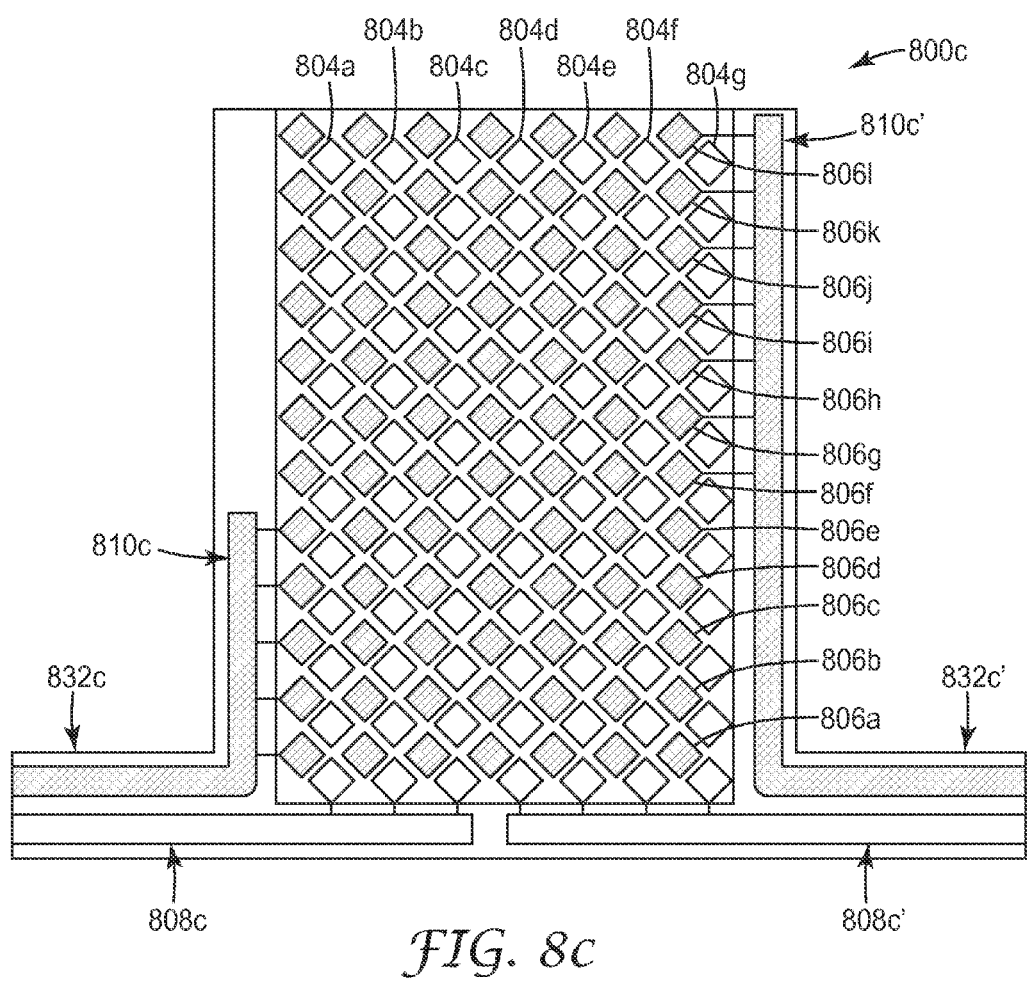
Figure 8D:
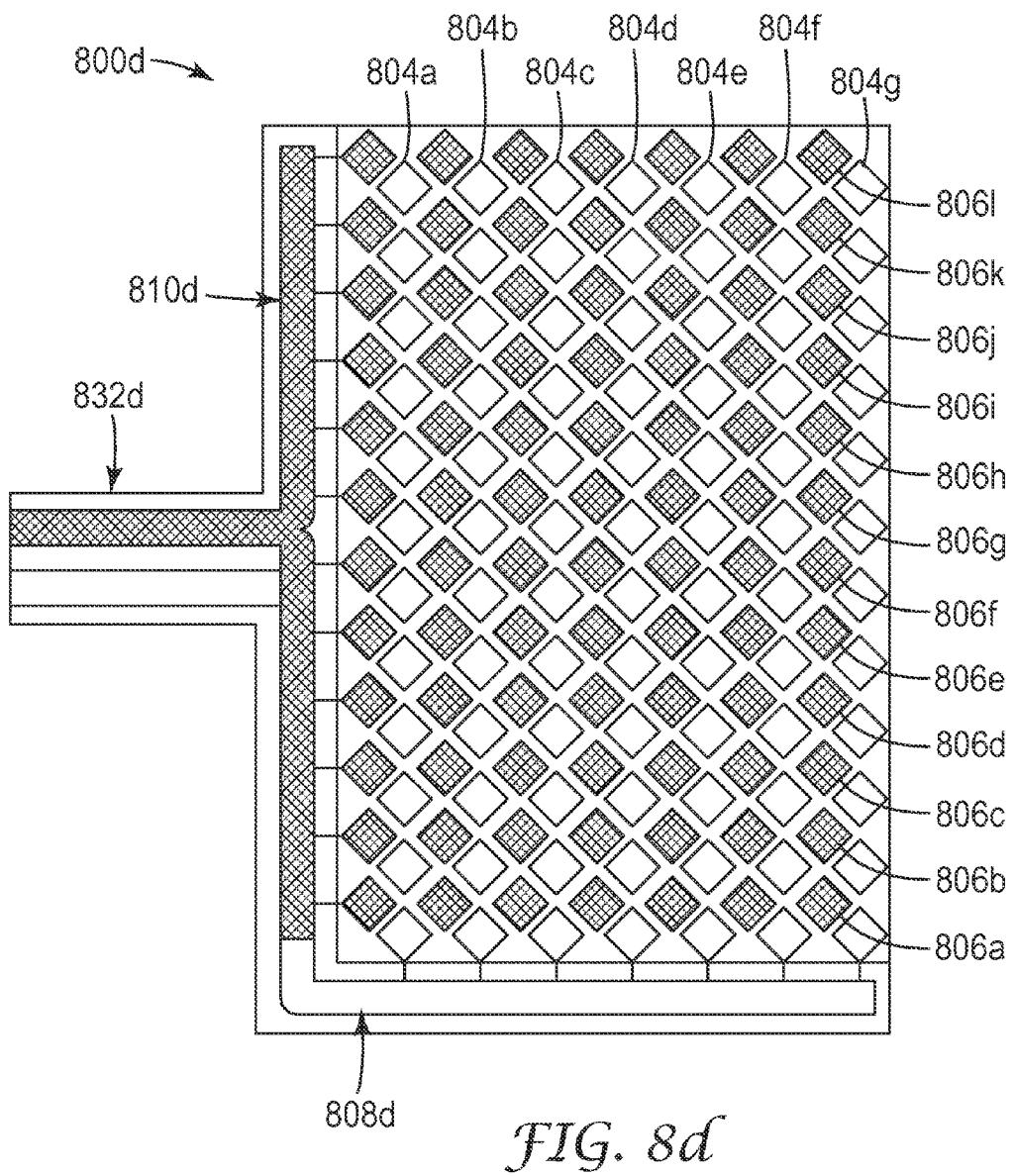
Figure 8E:
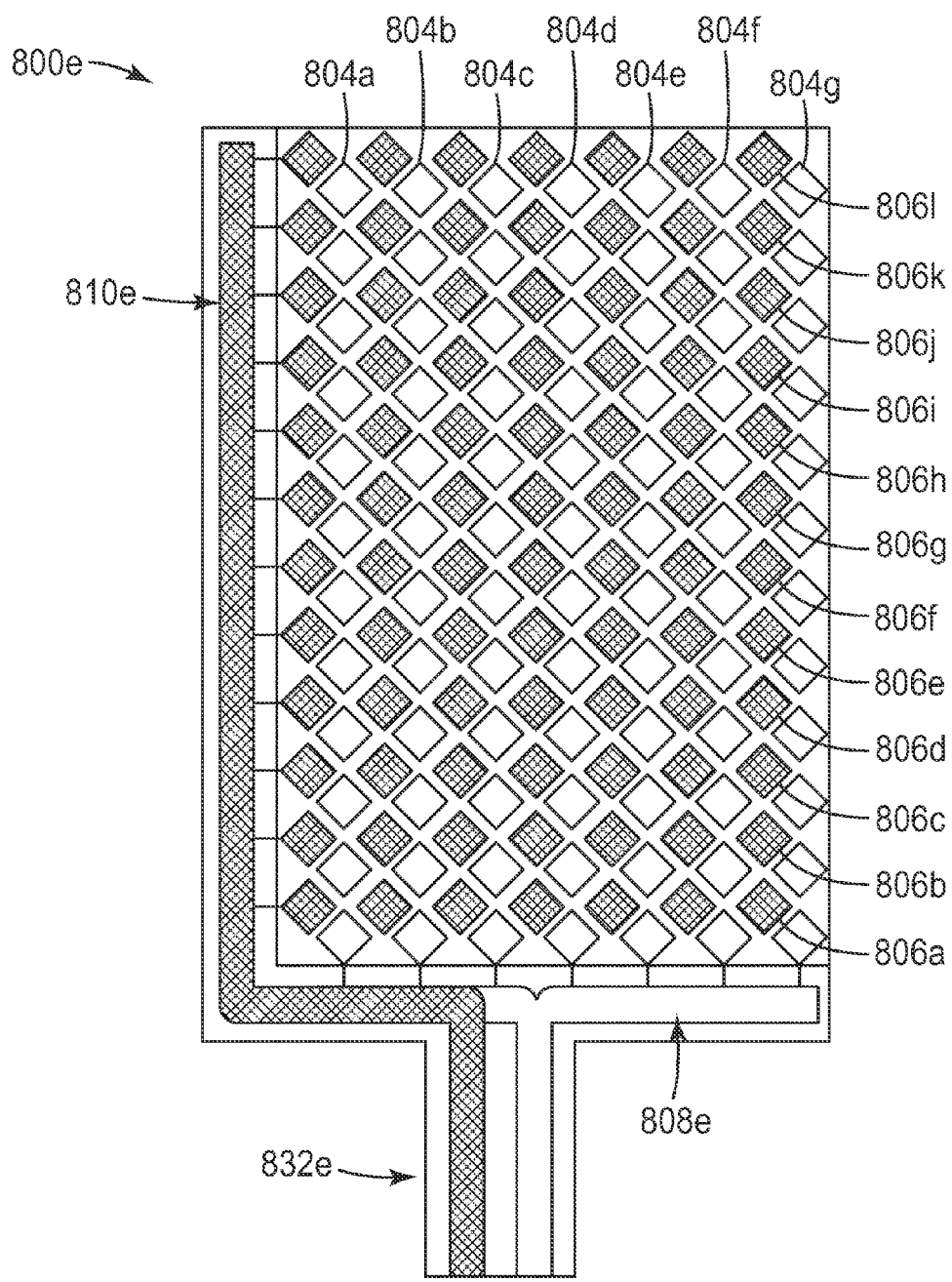

As suitable for the intended application, one or more connector tails may extend from the non-touch-sensing area of a multilayer structure at any suitable location. FIGS. 8a-8e illustrate exemplary embodiments of a multilayer structure according to aspects of the present invention, wherein various exemplary connector tail configurations are illustrated. Referring to FIG. 8a, multilayer structure 800a includes a longitudinal connector tail 832a extending from the non-touch-sensing area in the longitudinal direction of electrodes 804a-804g (column direction). Conductive circuits 808a associated with electrodes 804a-804g and conductive circuits 810a associated with electrodes 806a-806l extend into the non-touch-sensing area of multilayer structure 800a and along a length of connector tail 832a. Referring to FIG. 8b, multilayer structure 800b includes a longitudinal connector tail 832b extending from the non-touch-sensing area in the longitudinal direction of electrodes 806a-806l (row direction). Conductive circuits 808b associated with electrodes 804a-804g and conductive circuits 810b associated with electrodes 806a-806l extend into the non-touch-sensing area of multilayer structure 800b and along a length of connector tail 832b. Referring to FIG. 8c, multilayer structure 800c includes a first longitudinal connector tail 832c extending from the non-touch-sensing area in the longitudinal direction of electrodes 806a-806l (row direction). Conductive circuits 808c associated with electrodes 804a-804c and conductive circuits 810c associated with electrodes 806a-806e extend into the non-touch-sensing area of multilayer structure 800c and along a length of connector tail 832c. Multilayer structure 800c further includes a second longitudinal connector tail 832c' extending from the non-touch-sensing area in the longitudinal direction of electrodes 806a-806l (row direction) opposite to first connector tail 832c. Conductive circuits 808c' associated with electrodes 804d-804g and conductive circuits 810c' associated with electrodes 806f-806l extend into the non-touch-sensing area of multilayer structure 800c and along a length of connector tail 832c'. Referring to FIG. 8d, multilayer structure 800d includes a longitudinal connector tail 832d extending from the non-touch-sensing area in the longitudinal direction of electrodes 806a-806l (row direction). Conductive circuits 808d associated with electrodes 804a-804g and conductive circuits 810d associated with electrodes 806a-806l extend into the non-touch-sensing area of multilayer structure 800d and along a length of connector tail 832d. Referring to FIG. 8e, multilayer structure 800e includes a longitudinal connector tail 832e extending from the non-touch-sensing area in the longitudinal direction of electrodes 804a-804g (column direction). Conductive circuits 808e associated with electrodes 804a-804g and conductive circuits 810e associated with electrodes 806a-806l extend into the non-touch-sensing area of multilayer structure 800e and along a length of connector tail 832e.

Figure 9:
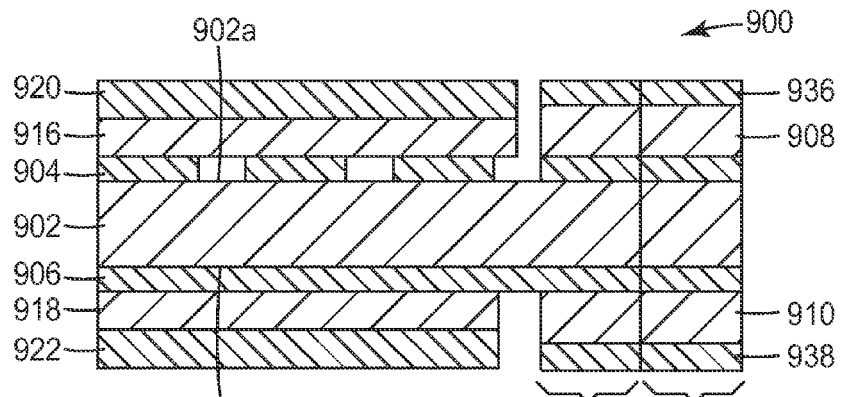
FIG. 9 is a cross-sectional view of an exemplary embodiment of a multilayer structure according to an aspect of the present invention.

In some embodiments, the conductive circuits in the non-touch-sensing area and/or the connector tail area of a multilayer structure are protected by a protective layer. Providing a protective layer may prevent corrosion of, and physical damage to, the conductive circuits, for example. FIG. 9 illustrates an exemplary embodiment a multilayer structure according to an aspect of the present invention that includes such a protective layer. Multilayer structure 900 may be a touch sensor for use in a touch sensitive device, such as, e.g., touch sensitive device 110 of FIG. 1. Similar to multilayer structure 400 illustrated in FIG. 4, multilayer structure 900 has two opposing sides and includes a central polymeric UV transparent substrate 902 having two major opposing surfaces 902a and 902b, a first transparent conductive layer 904 on first major surface 902a of central polymeric UV transparent substrate 902, a second transparent conductive layer 906 on second major surface 902b of central polymeric UV transparent substrate 902, a first metallic conductive layer 908 on first transparent conductive layer 904, a second metallic conductive layer 910 on second transparent conductive layer 906, a first adhesive layer 916 disposed on first transparent conductive layer 904, a second adhesive layer 918 disposed on second transparent conductive layer 906, a first hard coat layer 920 attached to first adhesive layer 916, and a second hard coat layer 922 attached to second adhesive layer 918. Multilayer structure 900 further includes a first protective layer 936 on first metallic conductive layer 908 and a second protective layer 938 on second metallic conductive layer 910. In the embodiment illustrated in FIG. 9, the protective layers are disposed on the metallic conductive layers in both the non-touch-sensing area (indicated by "A" in FIG. 9) and the connector tail area (indicated by "B" in FIG. 9) to provide protection of conductive circuits in these areas, for example. In some embodiments, the protective layers are disposed on the metallic conductive layers only in one of the non-touch-sensing area and the connector tail area. In some embodiments, only a portion of the metallic conductive layers is covered by the protective layers. For example, where first metallic conductive layer 908 is patterned to form a first set of conductive circuits and second metallic conductive layer 910 is patterned to form a second set of conductive circuits, first protective layer 936 and second protective layer 938 may be patterned correspondingly to cover the conductive circuits. In one aspect, the protective layer may be a photoimaging mask, such that the multilayer layer structure includes a patterned photoimaging mask on each metallic conductive layer. In at least one embodiment, first protective layer 936 and second protective layer 938 have a thickness of about 25 µm. In some embodiments, the protective layers have a thickness in the range of about 12 µm to about 25 µm. First protective layer 936 and second protective layer 938 may have different thicknesses, or may have substantially the same thickness. The protective layers may have a different thickness in the connector tail area of the multilayer structure than in the non-touch-sensing area of the multilayer structure as suitable for the intended application. The protective layers may include metals, such as, e.g., silver, nickel, gold, and tin. Metallic protective layers may have a thickness in the range of about 0.03 µm to about 1 µm.

Making multilayer structures according to aspects of the present invention may be accomplished in several ways. It includes steps of applying and patterning photoimaging layers and etching the underlying layers. Advantages of methods of making multilayer structures according to aspects of the present invention include a good registration between layers resulting in high manufacturing yield, a reduced number of layers, e.g., from 5 layers in an exemplary conventional structure to 3 layers in an exemplary structure according to an aspect of the present invention, a reduced number of process steps, and a reduction in manufacturing cost. Further, methods of making multilayer structures according to aspects of the present invention may avoid of air bubbles and foreign materials between transparent conductive layers, avoid sliding between transparent conductive layers, e.g., by using PET as dielectric medium, provide a thinner multilayer structure, and provide a structure wherein the patterned transparent conductive layers are indiscernible by the naked eye. FIGS. 10a-10i illustrate steps of an exemplary method of making a multilayer structure according to an aspect of the present invention.

Figure 10A:
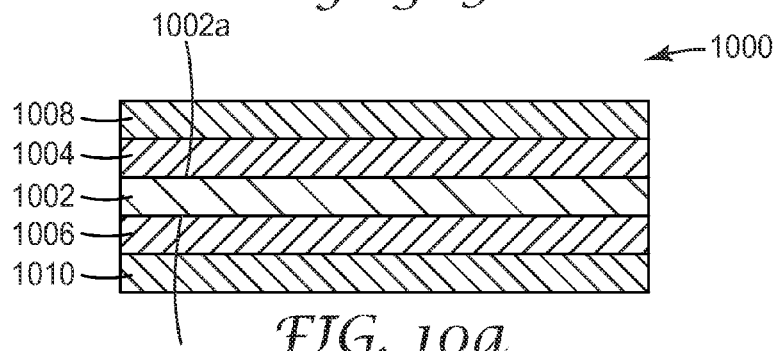
FIGS. 10a-10i are cross-sectional views of steps of an exemplary method of making a multilayer structure according to an aspect of the present invention.

Referring to FIG. 10a, a multilayer structure 1000 is provided. Multilayer structure 1000 has two opposing sides and includes a central polymeric UV transparent substrate 1002 having two major opposing surfaces 1002a and 1002b, a first transparent conductive layer 1004 on first major surface 1002a of central polymeric UV transparent substrate 1002, a second transparent conductive layer 1006 on second major surface 1002b of central polymeric UV transparent substrate 1002, a first metallic conductive layer 1008 on first transparent conductive layer 1004, and a second metallic conductive layer 1010 on second transparent conductive layer 1006. Multilayer structure 1000 may be fabricated in several ways. For example, the transparent conductive layers may be sputtered onto a roll of the central polymeric UV transparent substrate, and the metallic conductive layers may be sputtered onto the transparent conductive layers. The transparent conductive layers may be disposed on the central polymeric UV transparent substrate simultaneously or sequentially. In some embodiments, applying first transparent conductive layer 1004 and second transparent conductive layer 1006 simultaneously may be more efficient and provide better alignment of the layers. The metallic conductive layers may be disposed on the transparent conductive layers simultaneously or sequentially. In some embodiments, applying first metallic conductive layer 1008 and second metallic conductive layer 1010 simultaneously may be more efficient and provide better alignment of the layers. In one aspect, the hardness of the metallic conductive layers (e.g., copper) may be greater than the hardness of the transparent conductive layers (e.g., ITO). In a simultaneous approach, this helps to protect the transparent conductive layers from scratches during the manufacturing process, which otherwise would result in yield loss due to the fragile nature of the transparent conductive layers. In addition, the metallic conductive layers help the UV expose on both sides simultaneously, which otherwise would be impossible due to the UV transparency of the central polymeric UV transparent substrate (e.g., PET) and the transparent conductive layers.

Figure 10B:
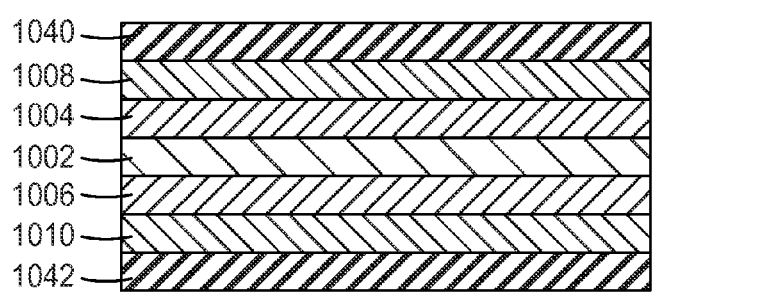
Figure 10C:
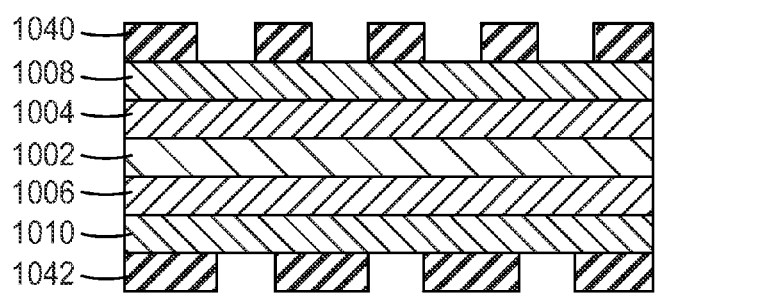

Referring to FIGS. 10b-10c, first photoimaging layers 1040, 1042 are applied (FIG. 10b) and patterned (FIG. 10c) on both metallic conductive layers to form photoimaging masks having desired patterns for the transparent conductive layers. In an alternative method, the photoimaging masks have desired patterns for the transparent conductive layers and the metallic conductive layers. First photoimaging layers 1040, 1042 may be applied by using standard laminating techniques. Applying first photoimaging layers 1040, 1042 may be done simultaneously or sequentially. In some embodiments, applying first photoimaging layers 1040, 1042 simultaneously may be more efficient and provide better alignment of the layers. In at least one embodiment, the first photoimaging layers have a thickness in the range of about 35 µm to about 50 µm. First photoimaging layers 1040, 1042 may be patterned by exposing them to UV light, through a mask, thereby crosslinking the exposed portions of the photoimaging layers, followed by developing the photoimaging layers with a dilute aqueous solution, e.g., a 0.5-1.5% by weight carbonate solution, until the uncrosslinked portions dissolve, resulting in desired patterns. Patterning first photoimaging layers 1040, 1042 may be done simultaneously or sequentially. In some embodiments, patterning first photoimaging layers 1040, 1042 simultaneously may be more efficient and provide better alignment of the patterns. As part of the simultaneous patterning, the photoimaging layers on opposing sides of multilayer structure 1000 may be simultaneously exposed to UV light. Examples of first photoimaging layers 1040, 1042 that can be used in aspects of the present invention include negative aqueous processable polymerizable photohardenable compositions, also referred to as photoresists, such as those disclosed in U.S. Pat. Nos. 3,469,982, 3,448,098, 3,867,153, and 3,526,504. Such photoresists include at least one polymer, additional crosslinkable monomeric units and a photoinitiator. Examples of polymers used in photoresists include copolymers of methylmethacrylate, ethyl acrylate and acrylic acid, copolymers of styrene and maleic anhydride isobutyl ester and the like. The crosslinkable monomeric units may be multiacrylates such as trimethylol propane triacrylate. Examples of some aqueous processable negative photoresists that can be used in aspects of the present invention are from polymethyl-methacrylates.

Figure 10D:
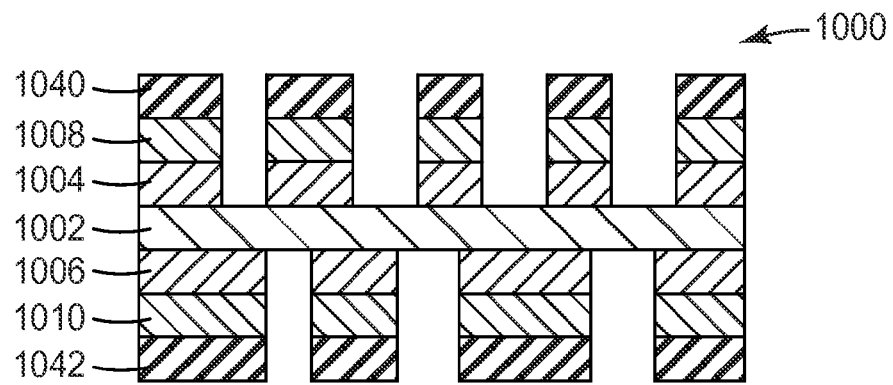

Referring to FIG. 10d, the portions of first metallic conductive layer 1008, second metallic conductive layer 1010, first transparent conductive layer 1004, and second transparent conductive layer 1006 exposed by the photoimaging masks are etched, whereby first transparent conductive layer 1004 is patterned to form a first set of electrodes, and second transparent conductive layer 1006 is patterned to form a second set of electrodes. Useful etchants are water soluble redox metal chlorides including cupric chloride and ferric chlorides and mineral acid such as hydrochloric acid, phosphoric acid and nitric acid, as further described in Singapore Patent Application No. 201105168-7, "Etching Method and Devices Produced Using the Etching Method". The useful concentration of the etchant varies with the specific selection thereof, the thickness of the transparent conductive layers and the metallic conductive layers to be etched, as well as the type and thickness of the photoresist chosen. Useful cupric chloride concentrations range from about 100 g/l to about 180 g/l and hydrochloric acid concentrations from about 0.04 to about 2 N. The etching step is accomplished by contacting unmasked areas of the transparent conductive layers and the metallic conductive layers with the redox metal chloride etchant. The time for etching depends upon the type and thickness of the transparent conductive layers and the metallic conductive layers to be etched and is typically from about 10 seconds to about 20 minutes. For example, when cupric chloride etchant is used, the etching time for a transparent conductive layer ITO—SiAlO—ITO and having a thickness of about 95 nm (about 20 nm ITO+ about 45 nm SiAlO+ about 20 nm ITO) and a metallic conductive layer of copper and having a thickness of about 8 µm is about 2 minutes. The etching solution is generally at a temperature of from about 50° C. to about 80° C. Etching the transparent conductive layers on opposing sides of multilayer structure 1000 may be done simultaneously or sequentially. In some embodiments, etching the transparent conductive layers on opposing sides of multilayer structure 1000 simultaneously may be more efficient. Etching the metallic conductive layers on opposing sides of multilayer structure 1000 may be done simultaneously or sequentially. In some embodiments, etching the metallic conductive layers on opposing sides of multilayer structure 1000 simultaneously may be more efficient. In one aspect, a cupric chloride etchant enables the simultaneous etching of the transparent conductive layers (e.g., ITO) and the metallic conductive layers (e.g., copper), thereby eliminating the need for two different etchants to etch the transparent conductive layers and the metallic conductive layers sequentially.

Figure 10E:
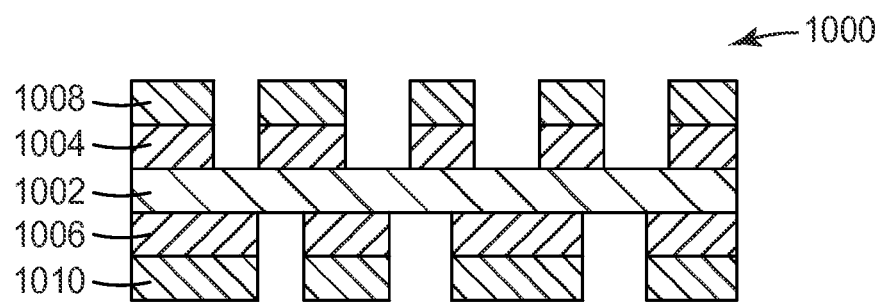

Referring to FIG. 10e, the photoimaging masks are removed. This may be accomplished by placing multilayer structure 1000 in a 30-50% solution of monoethanolamine at a temperature of from about 40° C. to about 50° C.

Figure 10F:
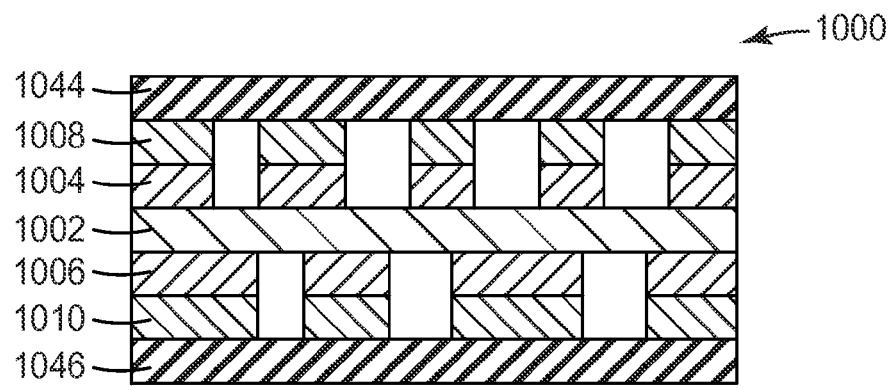
Figure 10G:
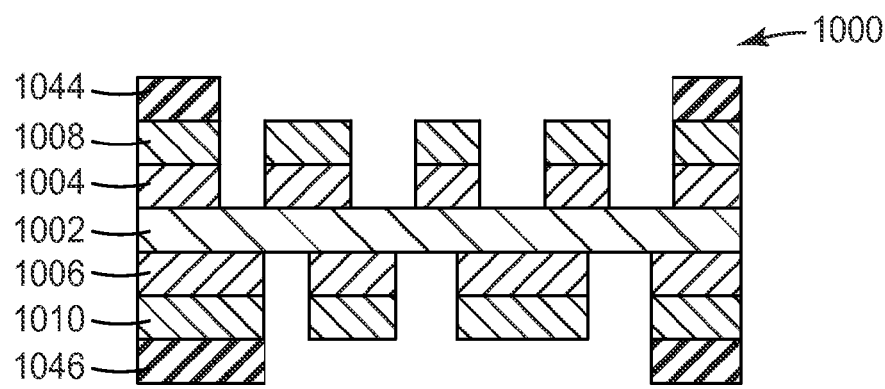

Referring to FIGS. 10f-10g, second photoimaging layers 1044, 1046 are applied (FIG. 10f) and patterned (FIG. 10g) over the remaining portions of each metallic conductive layer to form photoimaging masks having desired patterns for the metallic conductive layers. In an alternative method, e.g., when the photoimaging masks have desired patterns for the transparent conductive layers and the metallic conductive layers, the photoimaging masks protect the desired patterns of the metallic conductive layers. In some embodiments, first metallic conductive layer 1008 is patterned to form a first set of conductive circuits and second metallic conductive layer 1010 is patterned to form a second set of conductive circuits. In at least one embodiment, the desired pattern for one or both of the metallic conductive layers includes a circuit for connecting the transparent conductive layer to a device, such as, e.g., a touch sensitive device. Applying and patterning second photoimaging layers 1044, 1046 may be done as described above with respect to FIGS. 10b-10c.

Figure 10H:
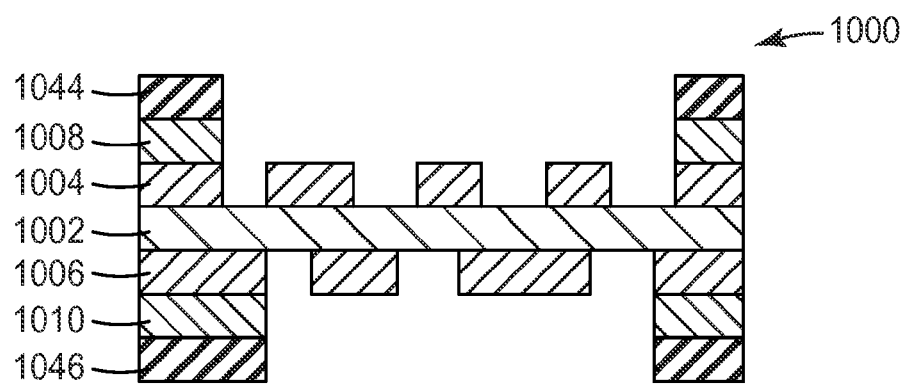

Referring to FIG. 10h, the exposed portions of first metallic conductive layer 1008 and second metallic conductive layer 1010 are etched. Etching of the exposed portions of the metallic conductive layers may be done as described above with respect to FIG. 10d. In at least one embodiment, the exposed portions of the metallic conductive layers are etched with an etchant that does not etch ITO. For example, the etchant may be ammonia-based. An ammonia-based etchant may selectively etch the metallic conductive layers (e.g., copper) without affecting the transparent conductive layers (e.g. ITO—SiAlO—ITO).

Figure 10I:
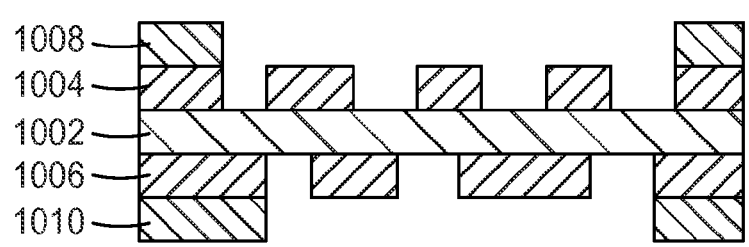

Referring to FIG. 10i, the photoimaging masks are removed. This may be accomplished by placing multilayer structure 1000 in a 30-50% solution of monoethanolamine at a temperature of from about 40° C. to about 50° C.

Figure 11:
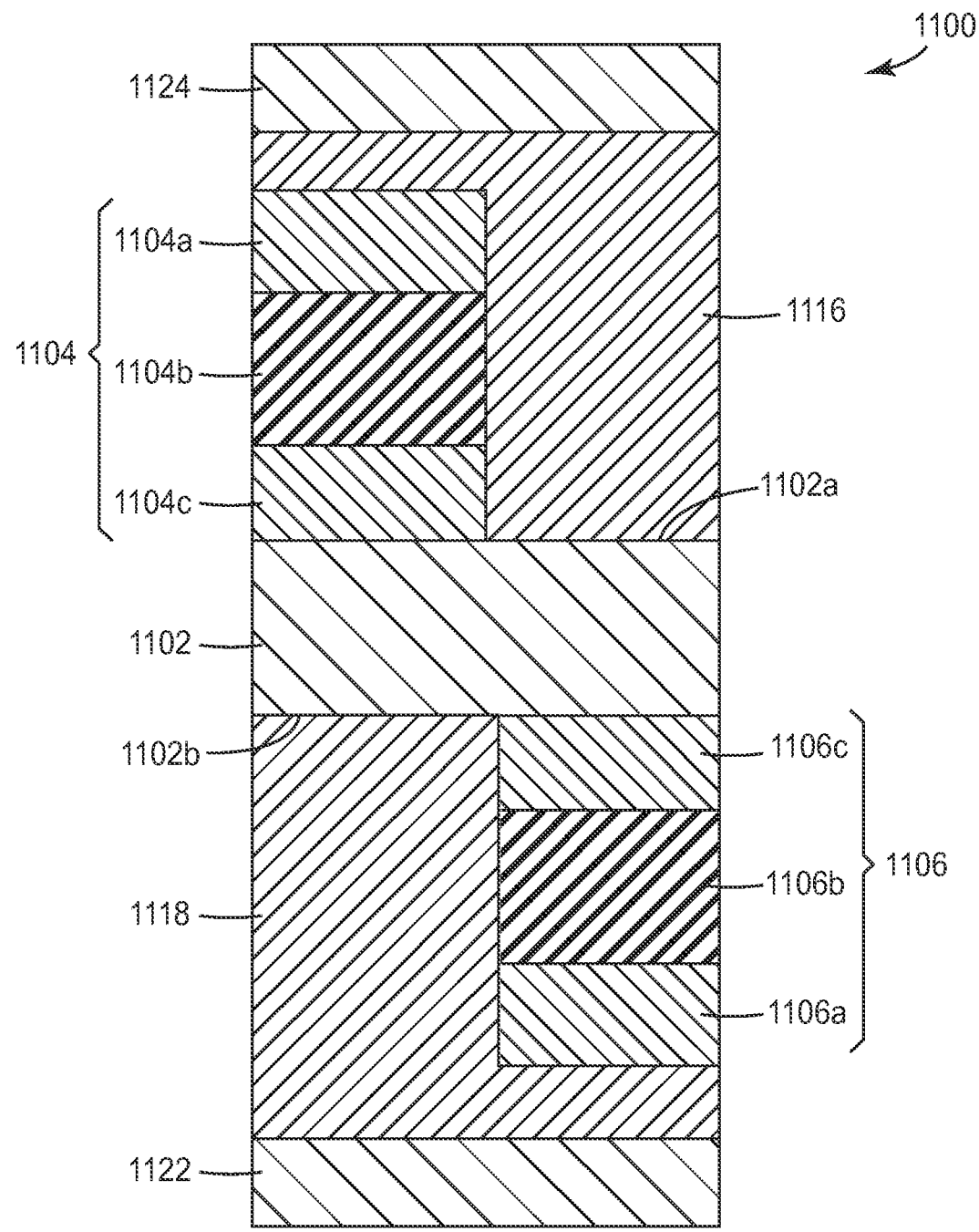
FIG. 11 is a cross-sectional view of an exemplary embodiment of a multilayer structure according to an aspect of the present invention.

FIG. 11 illustrates an exemplary embodiment where the patterned transparent conductive layers are index matched with at least the central polymeric UV transparent substrate. As a result, the patterns of the patterned transparent conductive layers are indiscernible by the naked eye. In one aspect, multilayer structure 1100 may be a touch sensor for use in a touch sensitive device, such as, e.g., touch sensitive device 110 of FIG. 1. Multilayer structure 1100 has two opposing sides and includes a central polymeric UV transparent substrate 1102 having two major opposing surfaces 1102a and 1102b, a first transparent conductive layer 1104 on first major surface 1102a of central polymeric UV transparent substrate 1102, and a second transparent conductive layer 1106 on second major surface 1102b of central polymeric UV transparent substrate 1102. First transparent conductive layer 1104 is patterned to form a first set of electrodes, and second transparent conductive layer 1106 is patterned to form a second set of electrodes. Central polymeric UV transparent substrate 1102 includes PET available under the trade designation Melinex ST 505 from DuPont Teijin Films, and has a thickness of about 125 µm and a refractive index of about 1.63. In some embodiments, the central polymeric UV transparent substrate has a refractive index of greater than about 1.60 or greater than about 1.63, which results in the electrode pattern being indiscernible by the naked eye. Central polymeric UV transparent substrate 1102 separates first transparent conductive layer 1104 from second transparent conductive layer 1106. First transparent conductive layer 1104 includes a first layer of ITO 1104a having a thickness of about 23 nm on a first layer of silicon oxide doped with aluminum 1104b having a thickness of about 49 nm on a second layer of ITO 1104c having a thickness of about 23 nm. Second transparent conductive layer 1106 includes a first layer of ITO 1106a having a thickness of about 23 nm on a first layer of silicon oxide doped with aluminum 1106b having a thickness of about 49 nm on a second layer of ITO 1106c having a thickness of about 23 nm. Multilayer 1100 further includes a first adhesive layer 1116 disposed on first transparent conductive layer 1104 and a second adhesive layer 1118 disposed on second transparent conductive layer 1106. First adhesive layer 1116 is disposed such that it substantially covers the first set of electrodes and the portions of central polymeric UV transparent substrate 1102 not covered by the first set of electrodes, and second adhesive layer 1118 is disposed such that it substantially covers the second set of electrodes and the portions of central polymeric UV transparent substrate 1102 not covered by the second set of electrodes. First adhesive layer 1116 includes an optically clear adhesive available under the trade designation 8142KCL from 3M Company, Minnesota, U.S.A., and has a thickness of about 50 µm and a refractive index of about 1.47. Second adhesive layer 1118 includes an optically clear adhesive available under the trade designation 8271 from 3M Company, Minnesota, U.S.A., and has a thickness of about 25 µm and a refractive index of about 1.49. Multilayer structure 1100 further includes a glass panel 1124 attached to first adhesive layer 1116. Glass panel 1124 has a thickness of about 0.7 mm. Multilayer structure 1100 further includes a hard coat layer 1122 attached to second adhesive layer 1118. Hard coat layer 1122 includes PET available under the trade designation Melinex ST 505 from DuPont Teijin Films, and has a thickness of about 125 µm.

Referring now to FIGS. 12a-12f, the reflectance measured in different areas of an exemplary embodiment of a multilayer structure according to an aspect of the present invention provides an indication of the level of indiscernibility by the naked eye of the patterned transparent conductive layers of the multilayer structure. Multilayer structure 1200 may be a touch sensor for use in a touch sensitive device, such as, e.g., touch sensitive device 110 of FIG. 1. Referring to FIGS.

Figure 12A:
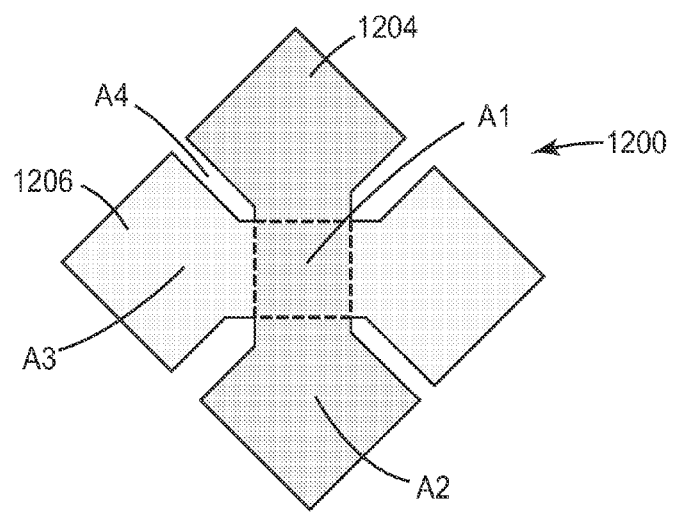
FIGS. 12a-12f are a top view, cross-sectional views, and a reflectance graph of an exemplary embodiment of a multilayer structure according to an aspect of the present invention.
Figures 12B, 12C:
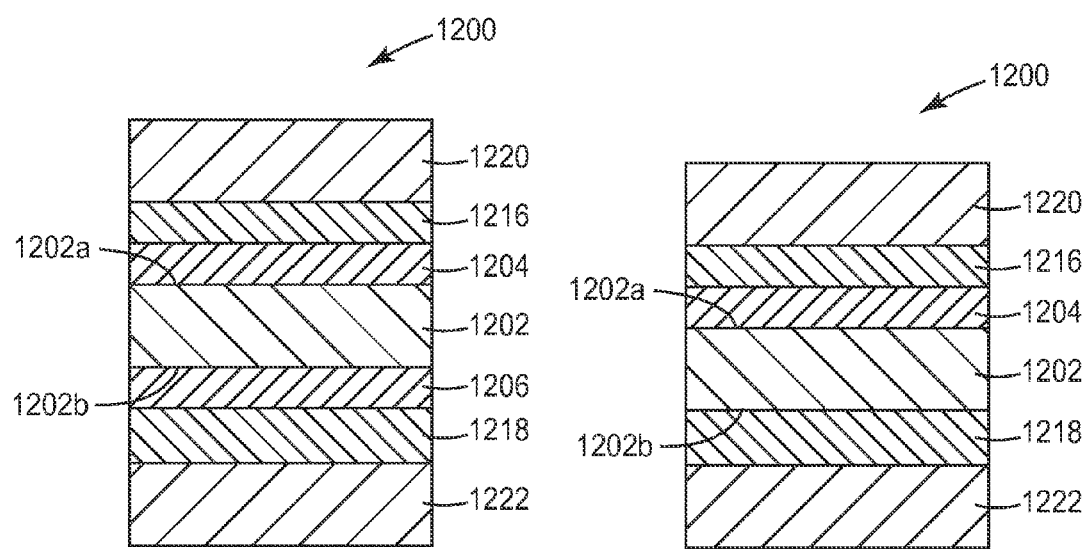
Figure 12D:
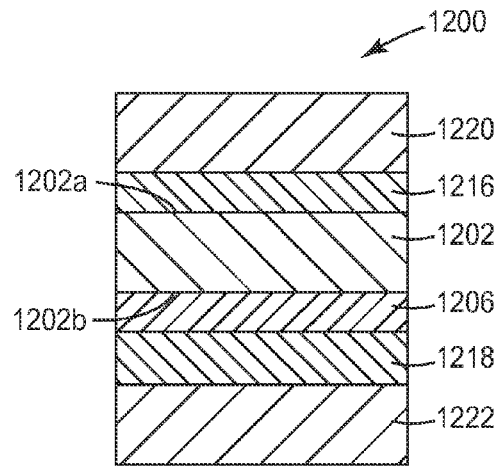
Figure 12E:
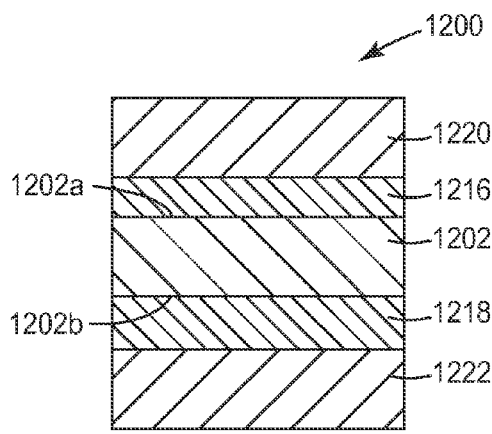
Figure 12F:
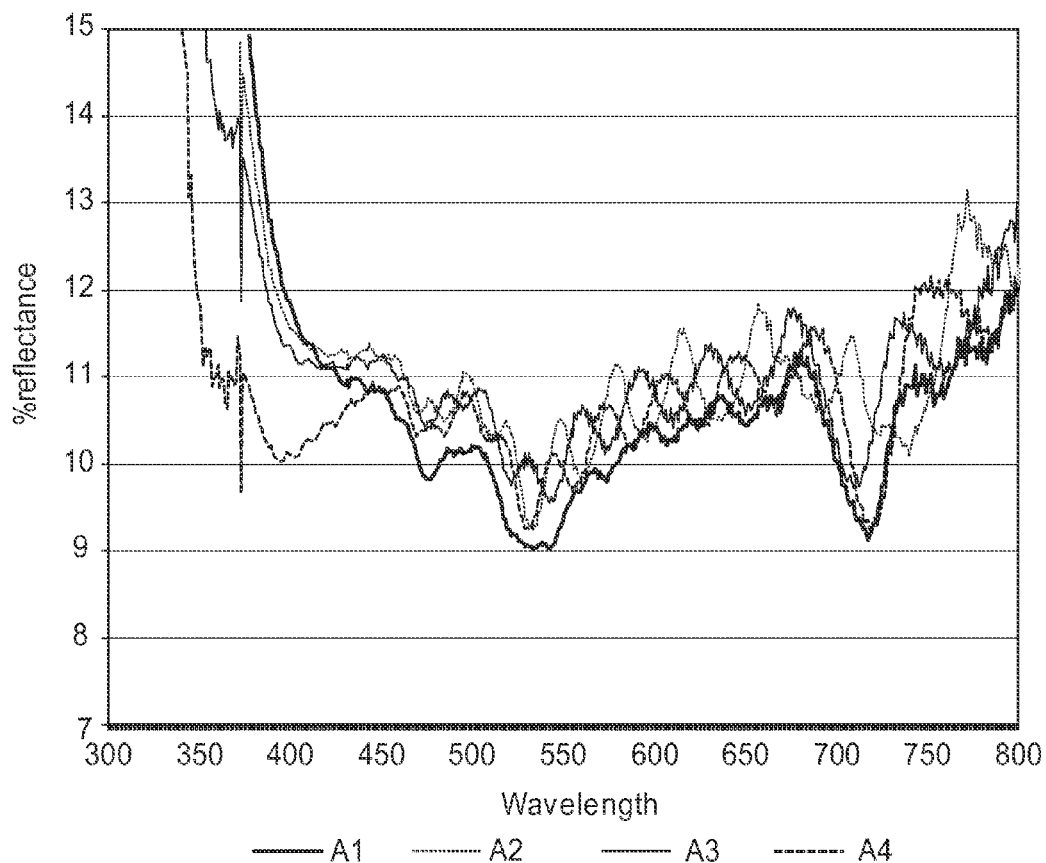

12*a*-12*e*, multilayer structure 1200 has two opposing sides and includes a central polymeric UV transparent substrate 1202 having two major opposing surfaces 1202*a* and 1202*b*, a first transparent conductive layer 1204 on first major surface 1202*a* of central polymeric UV transparent substrate 1202, a second transparent conductive layer 1206 on second major surface 1202*b* of central polymeric UV transparent substrate 1202. First transparent conductive layer 1204 is patterned to form a first set of electrodes, and second transparent conductive layer 1206 is patterned to form a second set of electrodes. Multilayer structure 1200 further includes a first adhesive layer 1216 disposed on first transparent conductive layer 1204 and a second adhesive layer 1218 disposed on second transparent conductive layer 1206. First adhesive layer 1216 is disposed such that it substantially covers the first set of electrodes and the portions of central polymeric UV transparent substrate 1202 not covered by the first set of electrodes, and second adhesive layer 1218 is disposed such that it substantially covers the second set of electrodes and the portions of central polymeric UV transparent substrate 1202 not covered by the second set of electrodes. Multilayer structure 1200 further includes a first hard coat layer 1220 attached to first adhesive layer 1216 and a second hard coat layer 1222 attached to second adhesive layer 1218. FIG. 12*a* is a top view of a portion of multilayer structure 1200 illustrating a portion of the first set of electrodes formed by first transparent conductive layer 1204 and a portion of the second set of electrodes formed by second transparent conductive layer 1206. FIGS. 12*b*-12*e* are cross-sectional views of multilayer structure 1200 taken in areas A1-A4 (FIG. 12*a*), respectively. Central polymeric UV transparent substrate 1202 includes PET available under the trade designation Melinex ST 505 from DuPont Teijin Films, and has a thickness of about 125 µm and a refractive index of about 1.63. First transparent conductive layer 1204 includes a first layer of ITO having a thickness of about 23 nm on a first layer of silicon oxide doped with aluminum having a thickness of about 49 nm on a second layer of ITO having a thickness of about 23 nm. Second transparent conductive layer 1206 includes a first layer of ITO having a thickness of about 23 nm on a first layer of silicon oxide doped with aluminum having a thickness of about 49 nm on a second layer of ITO having a thickness of about 23 nm. First adhesive layer 1216 includes an optically clear adhesive available under the trade designation 8142KCL from 3M Company, Minnesota, U.S.A., and has a thickness of about 50 µm and a refractive index of about 1.47. Second adhesive layer 1218 includes an optically clear adhesive available under the trade designation 8271 from 3M Company, Minnesota, U.S.A., and has a thickness of about 25 µm and a refractive index of about 1.49. First hard coat layer 1220 and second hard coat layer 1222 each include PET available under the trade designation Melinex ST 505 from DuPont Teijin Films, and have a thickness of about 125 µm. Alternatively, a PET available under the trade designation Melinex ST 504 from DuPont Teijin Films, or any suitable optically clear heat stabilized PET may be used. In some embodiments, the hard coat layers each include PET with a hard coat. In some embodiments, first hard coat layer 1220 includes glass and second hard coat layer 1222 includes a release liner, which in one aspect provides an economical and thin assembly. After removing the release liner, the multilayer structure can be laminated to an LCD panel, for example. As illustrated in FIG. 12*f*, the reflectance in different areas of multilayer structure 1200 and at wavelengths at least in the range of about 400 nm to about 800 nm is within about 1% range. Because visible light ranges from violet, roughly 400 nm, to deep red, roughly 700 nm, these measurements indicate a good level of indiscernibility by the naked eye of the patterned transparent conductive layers of the multilayer structure.

Following are exemplary embodiments of a method or an article according to aspects of the present invention.

Embodiment 1 is a method comprising: providing a multilayer structure having two opposing sides and comprising a central polymeric UV transparent substrate having two major opposing surfaces, a transparent conductive layer on each of the two major opposing surfaces of the polymeric substrate, and a metallic conductive layer on each transparent conductive layer; applying and patterning first photoimaging layers on both metallic conductive layers to form photoimaging masks having desired patterns for the transparent conductive layers; etching the portions of the metallic conductive layers and transparent conductive layers exposed by the photoimaging masks; removing the photoimaging masks; applying and patterning second photoimaging layers over the remaining portions of each metallic conductive layer to form photoimaging masks having desired patterns for the metallic conductive layers; and etching the exposed portions of the metallic conductive layers.

Embodiment 2 is a method comprising: providing a multilayer structure having two opposing sides and comprising a central polymeric UV transparent substrate having two major opposing surfaces, a transparent conductive layer on each of the two major opposing surfaces of the polymeric substrate, and a metallic conductive layer on each transparent conductive layer; applying and patterning first photoimaging layers on both metallic conductive layers to form photoimaging masks having desired patterns for the transparent conductive layers and the metallic conductive layers; etching the portions of the metallic conductive layers and transparent conductive layers exposed by the photoimaging masks; removing the photoimaging masks; applying and patterning second photoimaging layers over the remaining portions of each metallic conductive layer to form photoimaging masks protecting the desired patterns of the metallic conductive layers; and etching the exposed portions of the metallic conductive layers.

Embodiment 3 is the method of embodiment 1 or embodiment 2, wherein the central polymeric substrate is selected from the group consisting of polyesters, polycarbonates, liquid crystal polymers, polyimides, and polyethylene naphthalates.

Embodiment 4 is the method of embodiment 1 or embodiment 2, wherein the central flexible substrate comprises polyethylene terephthalate (PET).

Embodiment 5 is the method of embodiment 1 or embodiment 2, wherein the transparent conductive layer comprises indium tin oxide (ITO).

Embodiment 6 is the method of embodiment 5, wherein the ITO is amorphous.

Embodiment 7 is the method of embodiment 1 or embodiment 2, wherein the transparent conductive layer comprises layers of ITO and silicon oxide.

Embodiment 8 is the method of embodiment 7, where in the silicon oxide is doped with aluminum.

Embodiment 9 is the method of embodiment 1 or embodiment 2, wherein the photoimaging layers on opposing sides of the multilayer structure are simultaneously exposed to UV light.

Embodiment 10 is the method of embodiment 1 or embodiment 2, wherein the metallic conductive layers on opposing sides of the multilayer structure are etched simultaneously.

Embodiment 11 is the method of embodiment 1 or embodiment 2, wherein the transparent conductive layers on opposing sides of the multilayer structure are etched simultaneously.

Embodiment 12 is the method of embodiment 1 or embodiment 2, wherein the metallic conductive layer is selected from the group consisting of copper, aluminum, gold, silver, nickel, and tin.

Embodiment 13 is the method of embodiment 1 or embodiment 2, wherein the desired pattern for one or both of the metallic conductive layers comprises a circuit for connecting the transparent conductive layer to a device.

Embodiment 14 is the method of embodiment 1 or embodiment 2, wherein the exposed portions of the metallic conductive layers are etched with an etchant that does not etch ITO.

Embodiment 15 is the method of embodiment 14, wherein the etchant is ammonia-based.

Embodiment 16 is an article comprising: a multilayer structure having two opposing sides and comprising a central polymeric UV transparent substrate, a transparent conductive layer on each of the two major opposing surfaces of the polymeric substrate, and a metallic conductive layer on each transparent conductive layer.

Embodiment 17 is the article of embodiment 16, wherein the multilayer structure further comprises a patterned photoimaging mask on each metallic conductive layer.

Embodiment 18 is the article of embodiment 16, wherein both transparent conductive layers are patterned.

Embodiment 19 is the article of embodiment 18, wherein both metallic conductive layers are patterned.

Embodiment 20 is the article of embodiment 19, wherein the patterned metallic conductive layers comprise circuits including traces having a width of about 30 to about 100 micrometers, a height of about 3 to about 35 micrometers, and a pitch of about 60 to about 200 micrometers.

Embodiment 21 is the article of embodiment 19, wherein the patterned metallic conductive layers comprise circuits including traces, and wherein the traces of the patterned metallic conductive layer on one side of the multilayer structure are offset from the traces of the patterned metallic conductive layer on the other side of the multilayer structure such that the traces do not overlap in a direction normal to the plane of the substrate major surface.

Embodiment 22 is the article of embodiment 16, wherein the central polymeric substrate is selected from the group consisting of polyesters, polycarbonates, liquid crystal polymers, polyimides, and polyethylene naphthalates.

Embodiment 23 is the article of embodiment 16, wherein the central polymeric substrate comprises polyethylene terephthalate (PET).

Embodiment 24 is the article of embodiment 16, wherein the transparent conductive layer comprises indium tin oxide (ITO).

Embodiment 25 is the article of embodiment 24, wherein the ITO is amorphous.

Embodiment 26 is the article of embodiment 16, wherein the transparent conductive layer comprises layers of ITO and silicon oxide.

Embodiment 27 is the article of embodiment 26, wherein the silicon oxide is doped with aluminum.

Embodiment 28 is the article of embodiment 16, wherein the metallic conductive layer is selected from the group consisting of copper, aluminum, and gold.

Embodiment 29 is the article of embodiment 16, wherein the multilayer structure includes a non-touch-sensing area and at least one longitudinal connector tail extending from the non-touch-sensing area.

Embodiment 30 is an article comprising: a multilayer structure having two opposing sides and comprising a central polymeric UV transparent substrate having opposing major surfaces, and patterned transparent conductive layers on opposing major surfaces of the substrate, wherein the polymeric UV transparent substrate has a refractive index greater than about 1.60.

Embodiment 31 is the article of embodiment 30, wherein the polymeric UV transparent substrate has a refractive index greater than about 1.63.

Embodiment 32 is the article of embodiment 30 further comprising patterned metallic conductive layers on both transparent conductive layers.

Embodiment 33 is the article of embodiment 32, wherein the patterned metallic conductive layers comprise circuits including traces having a width of about 30 to about 100 micrometers, a height of about 3 to about 35 micrometers, and a pitch of about 60 to about 200 micrometers.

Embodiment 34 is the article of embodiment 32, wherein the patterned metallic conductive layers comprise circuits including traces, and wherein the traces of the patterned metallic conductive layer on one side of the multilayer structure are offset from the traces of the patterned metallic conductive layer on the other side of the multilayer structure such that the traces do not overlap in a direction normal to the plane of the substrate major surface.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, optical, and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method comprising:
providing a multilayer structure having two opposing sides and comprising a central polymeric UV transparent substrate having two major opposing surfaces, a transparent conductive layer on each of the two major opposing surfaces of the polymeric substrate, and a metallic conductive layer on each transparent conductive layer;

applying and patterning first photoimaging layers on both metallic conductive layers to form first masks having desired patterns for the transparent conductive layers;

etching portions of the metallic conductive layers and transparent conductive layers exposed by the first masks such that remaining portions of the transparent conductive layers have the desired patterns for the transparent conductive layers and remaining portions of the metallic conductive layers have the desired patterns for the transparent conductive layers which are different from desired patterns for the metallic conductive layers;

removing the first masks;

applying and patterning second photoimaging layers over the remaining portions of each metallic conductive layer to form second masks having the desired patterns for the metallic conductive layers; and etching portions of the metallic conductive layers exposed by the second masks using an etchant that selectively etches the metallic conductive layers thereby forming the desired patterns for the metallic conductive layers in the metallic conductive layers, the desired patterns for the metallic conductive layers comprising conductive traces positioned at a pitch in a range of 60 micrometers to 200 micrometers.

2. The method of claim 1, wherein the first photoimaging layers on opposing sides of the multilayer structure are simultaneously exposed to UV light.

3. The method of claim 1, wherein the portions of the metallic conductive layers on opposing sides of the multilayer structure that are exposed by the first masks are etched simultaneously.

4. The method of claim 1, the portions of the transparent conductive layers on opposing sides of the multilayer structure that are exposed by the first masks are etched simultaneously.

5. The method of claim 1, wherein the desired pattern for one or both of the metallic conductive layers comprises a circuit for connecting the transparent conductive layer to a device.

6. The method of claim 1, wherein the etchant that selectively etches the metallic conductive layers does not etch ITO.

7. A method comprising:
providing a multilayer structure having two opposing sides and comprising a central polymeric UV transparent substrate having two major opposing surfaces, a transparent conductive layer on each of the two major opposing surfaces of the polymeric substrate, and a metallic conductive layer on each transparent conductive layer;

applying and patterning first photoimaging layers on both metallic conductive layers to form first masks having desired patterns for the transparent conductive layers and the metallic conductive layers;

etching portions of the metallic conductive layers and transparent conductive layers exposed by the first masks such that remaining portions of the transparent conductive layers have the desired patterns for the transparent conductive layers and remaining portions of the metallic conductive layers include desired patterns for the metallic conductive layers and include undesired portions of the metallic conductive layers;

removing the first masks;

applying and patterning second photoimaging layers over the remaining portions of each metallic conductive layer to form second masks protecting the desired patterns of the metallic conductive layers; and etching portions of the metallic conductive layers exposed by the second masks using an etchant that selectively etches the metallic conductive layers to remove the undesired portions of the metallic conductive layers, wherein the desired patterns for the metallic conductive layers comprise conductive traces positioned at a pitch in a range of 60 micrometers to 200 micrometers.

8. The method of claim 7, wherein the first photoimaging layers on opposing sides of the multilayer structure are simultaneously exposed to UV light.

9. The method of claim 7, wherein the portions of the metallic conductive layers on opposing sides of the multilayer structure that are exposed by the first masks are etched simultaneously.

10. The method of claim 7, wherein the portions of the transparent conductive layers on opposing sides of the multilayer structure that are exposed by the first masks are etched simultaneously.

11. The method of claim 7, wherein the desired pattern for one or both of the metallic conductive layers comprises a circuit for connecting the transparent conductive layer to a device.

12. The method of claim 7, wherein the etchant that selectively etches the metallic conductive layers does not etch ITO.

* * * * *

UNITED STATES PATENT AND TRADEMARK OFFICE
CERTIFICATE OF CORRECTION

PATENT NO. : 9,642,243 B2  
APPLICATION NO. : 14/240815  
DATED : May 2, 2017  
INVENTOR(S) : Sebastian et al.

Page 1 of 1

It is certified that error appears in the above-identified patent and that said Letters Patent is hereby corrected as shown below:

In the Specification

Column 13
Line 17; After "provided" insert -- . --.

Line 39; Delete "-8061" and insert -- -8061 --, therefor.

Line 45; Delete "-8061" and insert -- -8061 --, therefor.

Line 47; Delete "-8061" and insert -- -8061 --, therefor.

Line 52; Delete "-8061" and insert -- -8061 --, therefor.

Line 60; Delete "-8061" and insert -- -8061 --, therefor.

Line 63; Delete "-8061" and insert -- -8061 --, therefor.

Column 14
Line 1; Delete "-8061" and insert -- -8061 --, therefor.

Line 4; Delete "-8061" and insert -- -8061 --, therefor.

Line 12; Delete "-8061" and insert -- -8061 --, therefor.

Signed and Sealed this  
Sixth Day of March, 2018

Andrei Iancu  
*Director of the United States Patent and Trademark Office*